US012571833B2

(12) United States Patent
Adams et al.

(10) Patent No.: US 12,571,833 B2
(45) Date of Patent: Mar. 10, 2026

(54) FORCE, DEFLECTION, RESISTANCE, AND TEMPERATURE TESTING SYSTEM AND METHOD OF USE

(71) Applicant: Modus Test, LLC, Richardson, TX (US)

(72) Inventors: Lynwood Adams, Richardson, TX (US); Jack Lewis, Richardson, TX (US); Njteh Keleshian, Plano, TX (US)

(73) Assignee: Modus Test, LLC, Richardson, TX (US)

( * ) Notice: Subject to any disclaimer, the term of this patent is extended or adjusted under 35 U.S.C. 154(b) by 259 days.

(21) Appl. No.: 18/304,135

(22) Filed: Apr. 20, 2023

(65) Prior Publication Data

US 2023/0296663 A1 Sep. 21, 2023

Related U.S. Application Data

(63) Continuation-in-part of application No. 17/835,620, filed on Jun. 8, 2022, now Pat. No. 11,674,996, and a continuation-in-part of application No. 17/712,392, filed on Apr. 4, 2022, now Pat. No. 11,668,731, said application No. 17/835,620 is a continuation of
(Continued)

(51) Int. Cl.
| | |
|---|---|
| *G01R 31/28* | (2006.01) |
| *G01R 1/02* | (2006.01) |
| *G01R 1/04* | (2006.01) |
| *G01R 1/067* | (2006.01) |
| *G01R 1/073* | (2006.01) |
| *G01R 31/00* | (2006.01) |
(Continued)

(52) U.S. Cl.
CPC .............................. *G01R 31/2808* (2013.01)

(58) Field of Classification Search
CPC ........ G01R 31/00; G01R 31/02; G01R 31/26; G01R 31/28; G01R 31/2808; G01R 1/02; G01R 1/04; G01R 1/067; G01R 1/073
See application file for complete search history.

(56) References Cited

U.S. PATENT DOCUMENTS

| | | |
|---|---|---|
| 6,350,138 B1 | 2/2002 | Atobe |
| 9,680,471 B2 | 6/2017 | Stirk |
(Continued)

*Primary Examiner* — Neel D Shah
(74) *Attorney, Agent, or Firm* — Christopher A. Proskey; BrownWinick Law Firm

(57) ABSTRACT

A method of use of the testing system having an electrical interconnect attached to an electrical interconnect testing device, a device under test aligned with the electrical interconnect, and an environmental chamber. The method comprising positioning the environmental chamber such that the device under test is operably contained within the environmental chamber, setting the environmental chamber to a first temperature, pressing down on the device under test with a plurality of different levels of force, or to a plurality of different positions, and taking at least one measurement of at least one electrical property while the device under test is pressed down. In various arrangements, the method of use further including the steps of adjusting the temperature within the environmental chamber to a second temperature and repeating the steps of pressing down on the device under test and taking at least one measurement of at least one electrical property.

43 Claims, 14 Drawing Sheets

Related U.S. Application Data application No. 16/983,309, filed on Aug. 3, 2020, now Pat. No. 11,385,277, said application No. 17/712,392 is a continuation of application No. 16/882,917, filed on May 26, 2020, now Pat. No. 11,313,880, which is a continuation of application No. 16/181,846, filed on Nov. 6, 2018, now Pat. No. 10,705,120, which is a continuation of application No. 15/462,383, filed on Mar. 17, 2017, now Pat. No. 10,156,586, which is a continuation-in-part of application No. 14/996,045, filed on Jan. 14, 2016, now Pat. No. 9,885,737.

(60) Provisional application No. 62/882,891, filed on Aug. 5, 2019, provisional application No. 62/104,117, filed on Jan. 16, 2015.

(51) Int. Cl.
  *G01R 31/02* (2006.01)
  *G01R 31/26* (2020.01)

(56) References Cited

U.S. PATENT DOCUMENTS

| | | | |
|---|---|---|---|
| 10,156,586 | B2 | 12/2018 | Adams |
| 10,534,017 | B2 | 1/2020 | Adams |
| 10,564,212 | B2 * | 2/2020 | Mardi ..................... G01R 31/69 |
| 10,705,120 | B2 | 7/2020 | Adams |
| 11,313,880 | B2 | 4/2022 | Adams |
| 11,385,277 | B2 | 7/2022 | Adams |
| 11,668,731 | B2 | 6/2023 | Adams |
| 11,674,996 | B2 | 6/2023 | Adams |
| 2005/0026491 | A1 * | 2/2005 | Gattuso ................ G01R 1/0466 439/342 |
| 2005/0035754 | A1 | 2/2005 | Ho |
| 2005/0099763 | A1 | 5/2005 | Rathburn |
| 2005/0218429 | A1 | 10/2005 | Mazza |
| 2007/0075726 | A1 | 4/2007 | Chan |
| 2007/0152694 | A1 | 7/2007 | Yin |
| 2007/0229102 | A1 | 10/2007 | Eldridge |
| 2007/0287304 | A1 | 12/2007 | Eldridge |
| 2008/0126863 | A1 | 5/2008 | Co |
| 2008/0305670 | A1 | 12/2008 | Gattuso |
| 2009/0102457 | A1 | 4/2009 | Vayner |
| 2010/0134134 | A1 | 6/2010 | Grover |
| 2012/0092034 | A1 * | 4/2012 | Erdman ................ G01R 1/0466 324/754.14 |
| 2012/0199985 | A1 | 8/2012 | Rathburn |
| 2013/0135002 | A1 | 5/2013 | Grover |
| 2014/0103949 | A1 | 4/2014 | Erdman |
| 2016/0209443 | A1 | 7/2016 | Adams et al. |
| 2017/0192046 | A1 | 7/2017 | Adams |
| 2019/0072585 | A1 | 3/2019 | Adams |
| 2020/0088787 | A1 | 3/2020 | Ochotorena, Jr. |
| 2020/0319231 | A1 | 10/2020 | Adams |
| 2020/0379013 | A1 | 12/2020 | Wang |
| 2021/0368803 | A1 | 12/2021 | Swamy |
| 2021/0368806 | A1 | 12/2021 | Rifa |
| 2021/0368907 | A1 | 12/2021 | Wardlaw |
| 2023/0296663 | A1 | 9/2023 | Adams |
| 2023/0341457 | A1 | 10/2023 | Adams |

* cited by examiner

FIG. 5

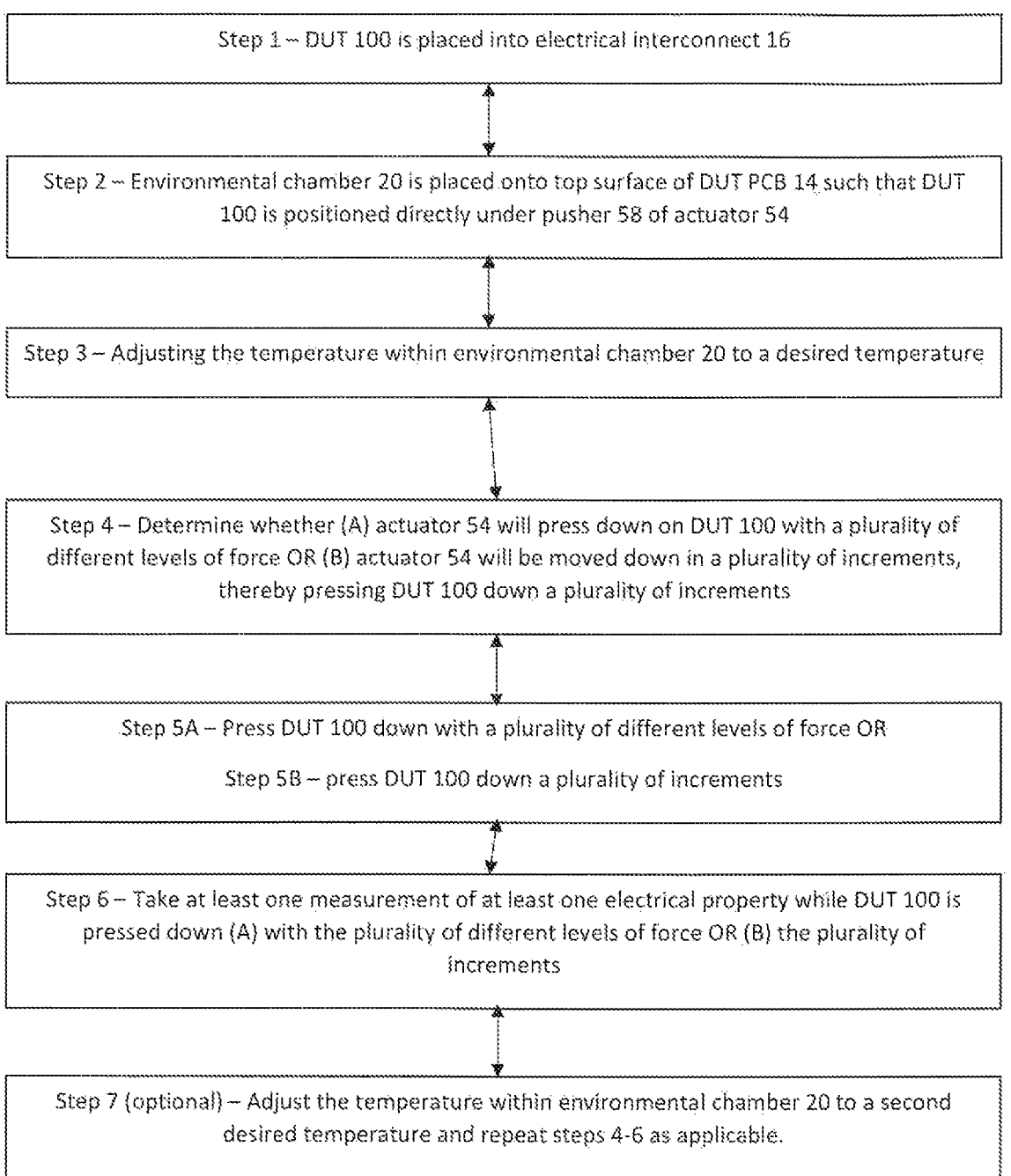

Step 1 – DUT 100 is placed into electrical interconnect 16

Step 2 – Environmental chamber 20 is placed onto top surface of DUT PCB 14 such that DUT 100 is positioned directly under pusher 58 of actuator 54

Step 3 – Adjusting the temperature within environmental chamber 20 to a desired temperature Step 4 – Determine whether (A) actuator 54 will press down on DUT 100 with a plurality of different levels of force OR (B) actuator 54 will be moved down in a plurality of increments, thereby pressing DUT 100 down a plurality of increments Step 5A – Press DUT 100 down with a plurality of different levels of force OR Step 5B – press DUT 100 down a plurality of increments Step 6 – Take at least one measurement of at least one electrical property while DUT 100 is pressed down (A) with the plurality of different levels of force OR (B) the plurality of increments Step 7 (optional) – Adjust the temperature within environmental chamber 20 to a second desired temperature and repeat steps 4-6 as applicable.

FIG. 14

FORCE, DEFLECTION, RESISTANCE, AND TEMPERATURE TESTING SYSTEM AND METHOD OF USE

CROSS-REFERENCE TO RELATED APPLICATIONS

The present application is a continuation-in-part of U.S. application Ser. No. 17/835,620 filed on Jun. 8, 2022, which is a continuation of U.S. patent application Ser. No. 16/983, 309 filed on Aug. 3, 2020, now U.S. Pat. No. 11,385,277, which claims priority to U.S. Provisional Patent Application No. 62/882,891 filed Aug. 5, 2019, all of which are hereby incorporated by reference herein in their entireties.

The present application is also a continuation-in-part of U.S. application Ser. No. 17/712,392 filed on Apr. 4, 2022, which is a continuation of U.S. application Ser. No. 16/882, 917 filed on May 26, 2020, now U.S. Pat. No. 11,313,880, which is a continuation of U.S. application Ser. No. 16/181, 846 filed on Nov. 6, 2018, now U.S. Pat. No. 10,705,120, which is a continuation of U.S. application Ser. No. 15/462, 383 filed on Mar. 17, 2017, now U.S. Pat. No. 10,156,586, which is a continuation-in-part of U.S. application Ser. No. 14/996,045 filed on Jan. 14, 2016, now U.S. Pat. No. 9,885,737, which claims priority to U.S. Provisional Patent Application No. 62/104,117 filed on Jan. 16, 2015, all of which are hereby incorporated by reference in their entireties.

FIELD OF THE DISCLOSURE

This disclosure relates to a testing system. More specifically and without limitation, this disclosure relates to a testing system for electrical interconnects, and related method of use.

OVERVIEW OF THE DISCLOSURE

Semiconductor chips have been developed for a wide variety of purposes. Along with the development of these semiconductor chips, a need developed to test these semiconductor chips to ensure that they are manufactured within specified tolerances and function properly. Many manufacturers of semiconductor chips such as Intel®, AMD®, Xilinx®, Texas Instruments®, NVIDIA®, Qualcomm®, among countless others, manufacture semiconductor chips which are then tested by a chip testing system having a device under test printed circuit board (DUT PCB) with an electrical interconnect, also known as a test socket, that is attached thereto. The DUT PCB and electrical interconnects are generally custom made to fit each specific semiconductor chip, making them quite expensive.

Manufacturers tend to simultaneously manufacture a variety of semiconductor chips within their facilities to maximize their overhead and equipment utilization rates. Due to these multiple product lines, manufacturers have a need to test a variety of semiconductor chips at the same time, each type of chip requiring a special electrical interconnect and DUT PCB. Since cleanroom space is extremely limited it is undesirable to have a dedicated testing machine for each type of electrical interconnects and DUT PCB. Conventional testing systems are not capable of testing a plurality of electrical interconnects, nor are conventional testing systems easily converted between configurations for testing different electrical interconnects.

Therefore, manufacturers of semiconductor chips have a need for a system for testing electrical interconnects, and DUT PCBs, that is capable of testing a variety of electrical interconnects and DUT PCBs. Manufacturers of semiconductor chips also have a need for a system for testing electrical interconnects, and DUT PCBs, that quickly and easily converts between testing various electrical interconnects, which are problems not solved by the prior art. Manufacturers of semiconductor chips further have a need for this testing system to be as small as possible to maximize valuable cleanroom space.

Thus, it is a primary object of the disclosure to provide an electronic testing system and method of use that improves upon the state of the art.

Another object of the disclosure is to provide an electronic testing system and method of use that quickly converts between configurations for testing different electrical interconnects.

Yet another object of the disclosure is to provide an electronic testing system and method of use that easily converts between configurations for testing different electrical interconnects.

Another object of the disclosure is to provide an electronic testing system and method of use that is easy to use.

Yet another object of the disclosure is to provide an electronic testing system and method of use that provides accurate testing for electrical interconnects.

Another object of the disclosure is to provide an electronic testing system and method of use that can be used with a wide variety of electrical interconnects.

Yet another object of the disclosure is to provide an electronic testing system and method of use that is relatively inexpensive.

Another object of the disclosure is to provide an electronic testing system and method of use that has a long useful life.

Yet another object of the disclosure is to provide an electronic testing system and method of use that has a small footprint.

Another object of the disclosure is to provide an electronic testing system and method of use that minimizes the amount of space required to test a variety of electrical interconnects.

Yet another object of the disclosure is to provide an electronic testing system and method of use that minimizes the capital cost for testing equipment for testing a variety of electrical interconnects.

Another object of the disclosure is to provide an electronic testing system and method of use that provides for quick removal of and replacement of DUT PCBs having electrical interconnects thereon.

Yet another object of the disclosure is to provide an electronic testing system and method of use that is high quality.

Another object of the disclosure is to provide an electronic testing system and method of use that is durable.

Yet another object of the disclosure is to provide an electronic testing system and method of use that can be used with a wide variety of other testing equipment.

Another object of the disclosure is to provide an electronic testing system and method of use that is modular in nature.

Yet another object of the disclosure is to provide an electronic testing system and method of use that can be used with any size of DUT PCB.

Another object of the disclosure is to provide an electronic testing system and method of use that can be used with any test socket.

Yet another object of the disclosure is to provide an electronic testing system and method of use that provides a high density of pins.

Another object of the disclosure is to provide an electronic testing system and method of use that can be formed out of a plurality of testing modules.

Yet another object of the disclosure is to provide an electronic testing system and method of use that has the ability to perform tests under extreme conditions such as high or low temperatures.

These and other objects, features, or advantages of the present disclosure will become apparent from the specification and claims.

SUMMARY OF THE DISCLOSURE

A testing system having a testing module with electrical testing components, with at least one such electrical testing component having compressible electrical contacts is presented. The testing system also having an environmental chamber configured to control temperature. A method of using the testing system is also presented, the method comprising: providing a device under test having compressible electrical contacts; aligning the compressible electrical contacts of the at least one electrical testing component to the compressible electrical contacts of the device under test; pressing the device under test into the electrical testing components by pressing with different levels of force of pressing the device under test down in a plurality of increments; and taking measurements of electrical properties while the device under test is being pressed down. The method also comprising taking measurements of electrical properties while controlling the temperature within the environmental chamber.

BRIEF DESCRIPTION OF THE FIGURES

Figure 5:
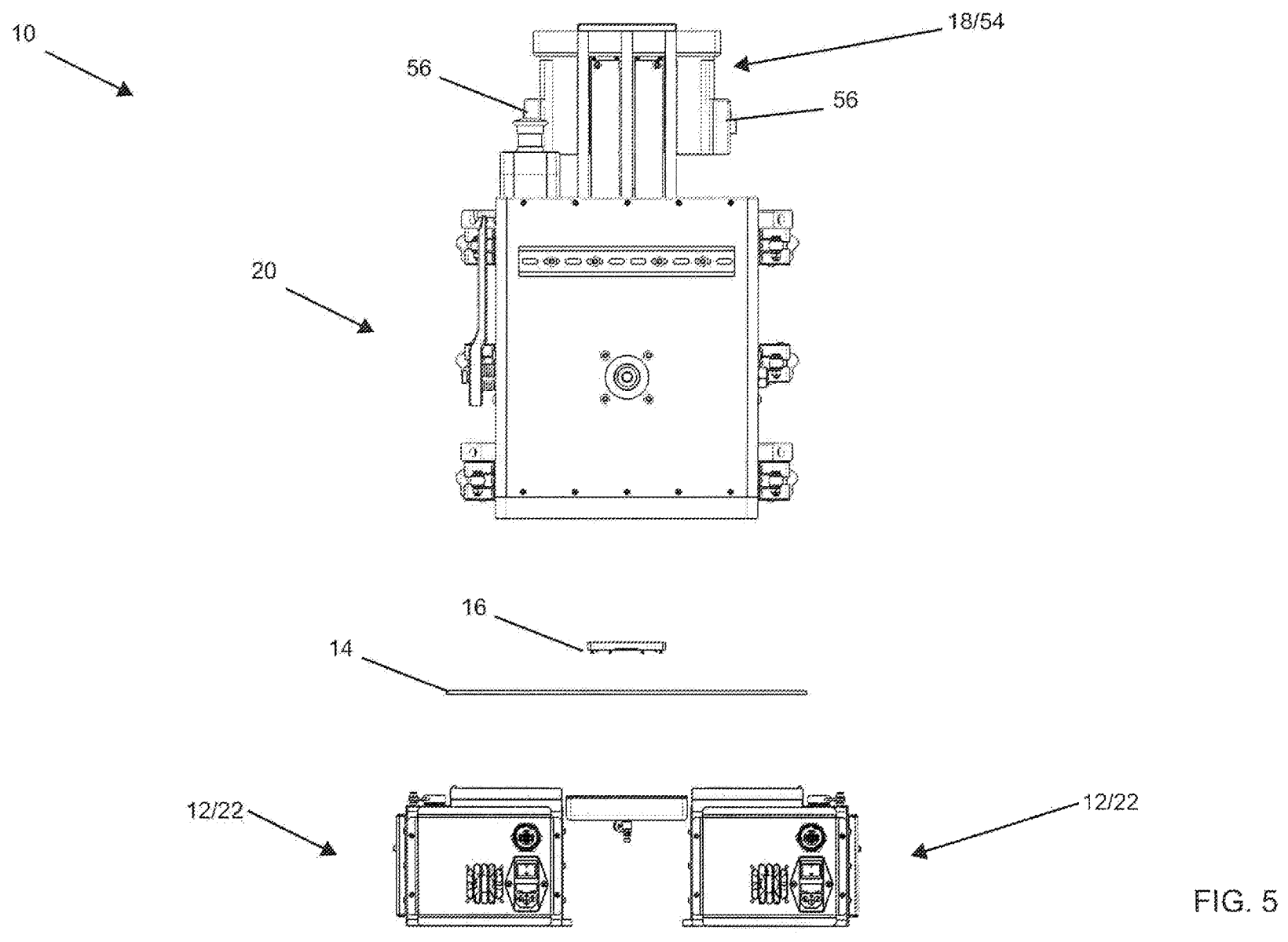

FIG. 5 is an exploded rear view of the testing system, the view showing an electrical interconnect testing device formed of two testing modules, a DUT PCB, an electrical interconnect, an environmental chamber, and an actuator connected to the environmental chamber.

FIG. 14 is a plan view of the steps of a testing method.

DETAILED DESCRIPTION OF THE DISCLOSURE

Figure 1:
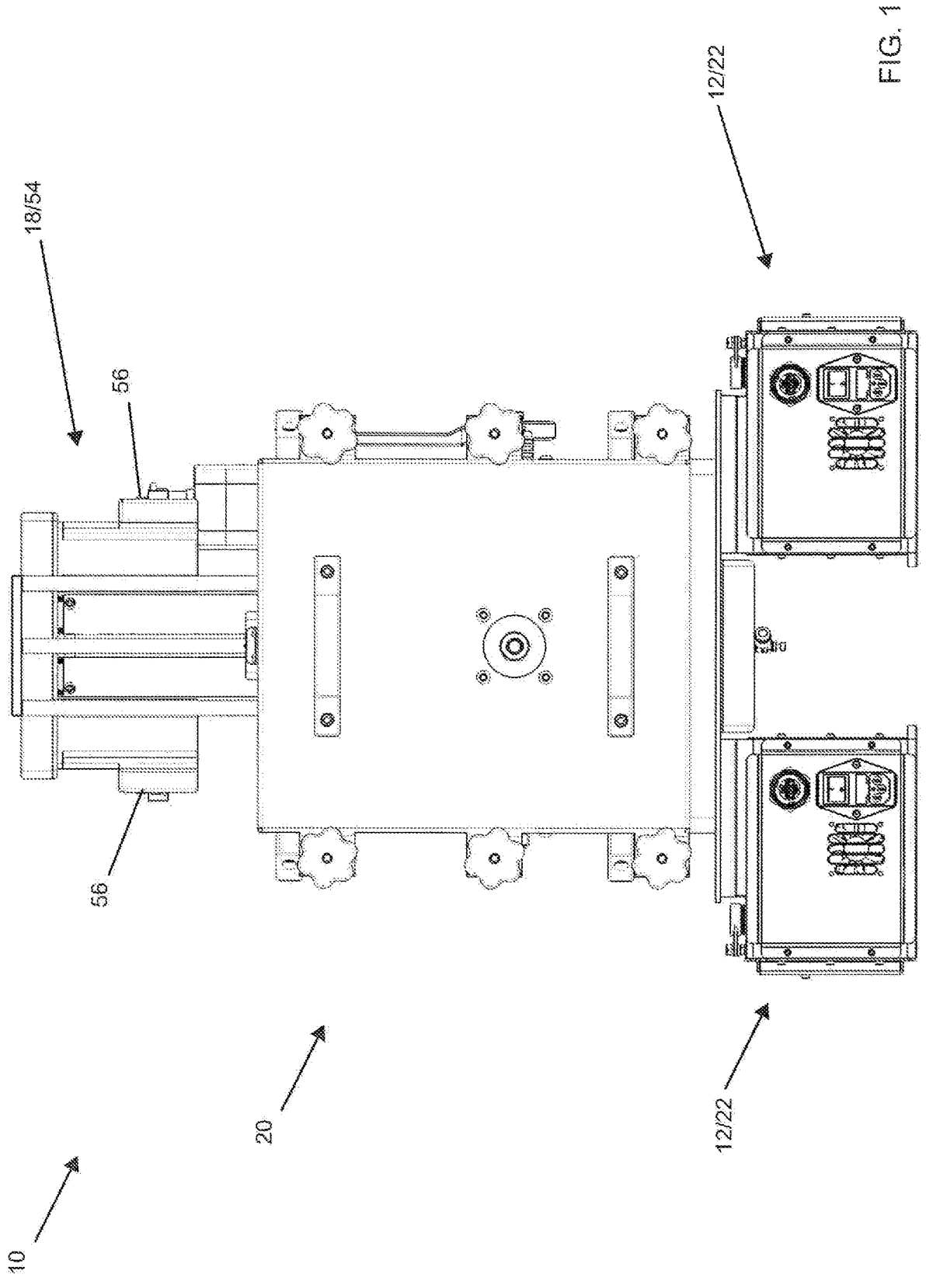
FIG. 1 is a front elevation view of the testing system, the view showing an electrical interconnect testing device formed of two testing modules, a device under test printed circuit board (DUT PCB) resting on top of the testing modules and spanning between the testing modules, an environmental chamber on top of the DUT PCB, and an actuator (or stepper) configured to press down on a device under test.
Figure 2:
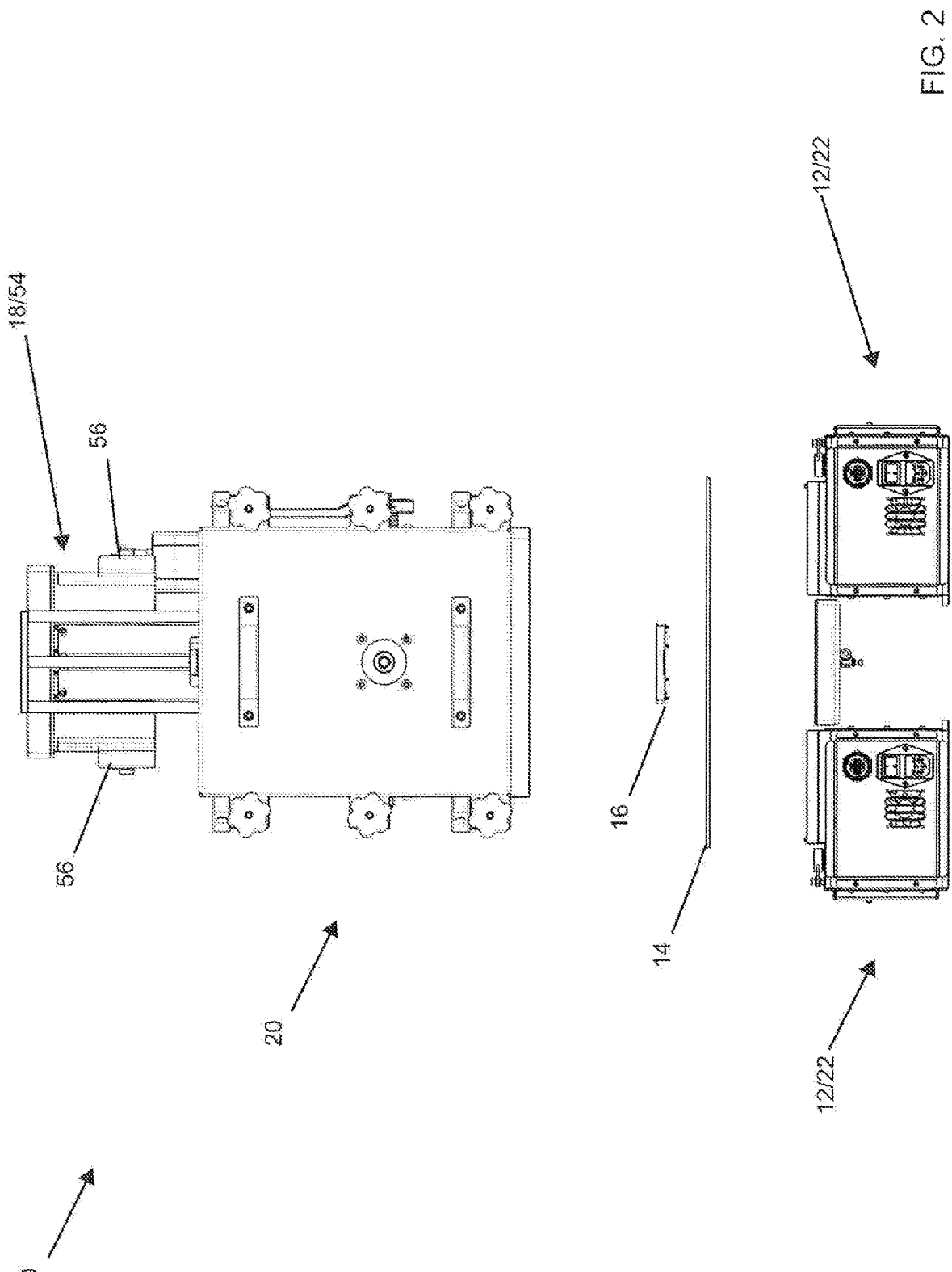
FIG. 2 is an exploded front view of the testing system, the view showing an electrical interconnect testing device formed of two testing modules, a DUT PCB, an electrical interconnect, an environmental chamber, and an actuator connected to the environmental chamber.
Figure 3:
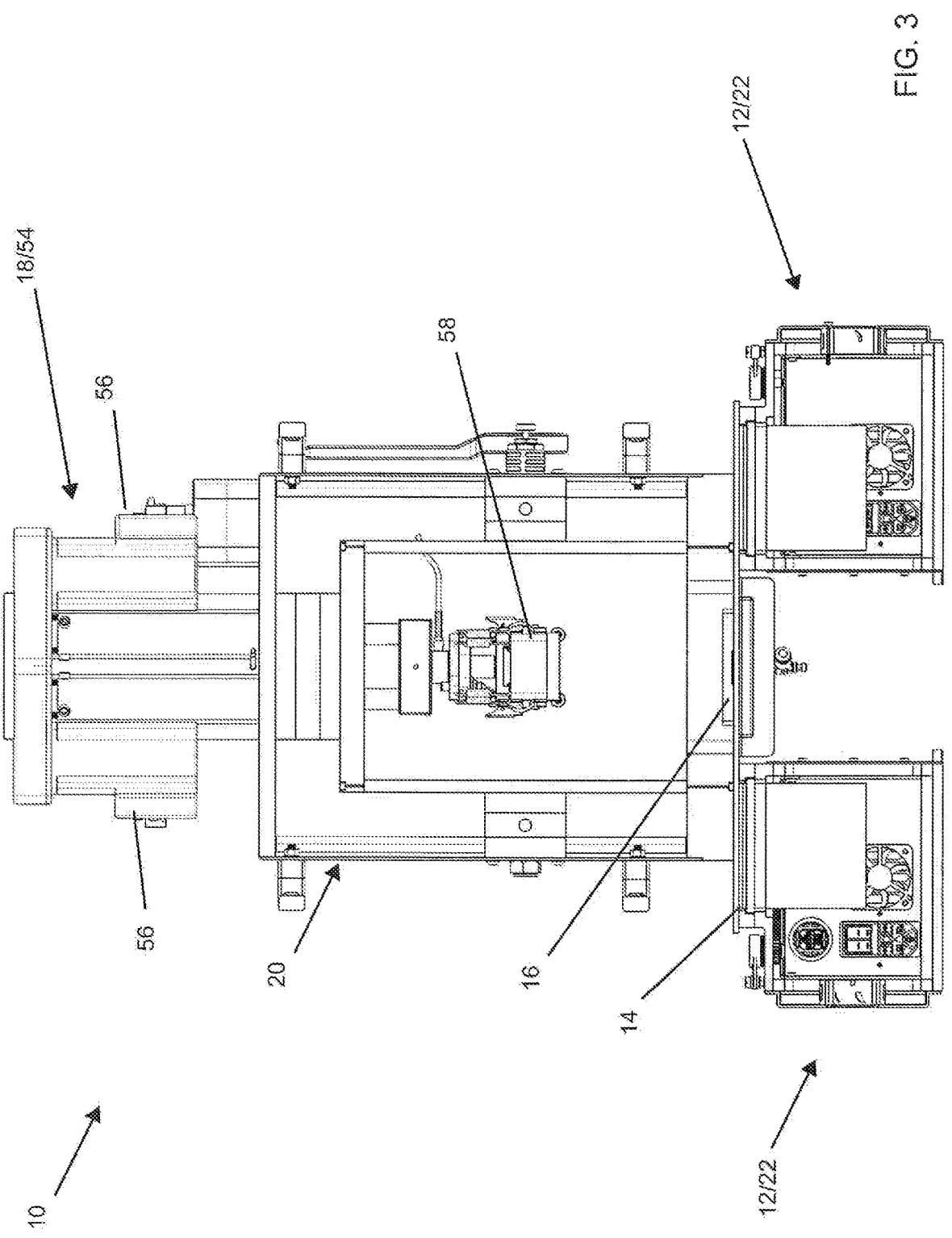
FIG. 3 is a front section view of the testing system, the view showing internal components of an electrical interconnect testing device, a DUT PCB resting on the top of the electrical interconnect testing device, and an electrical interconnect positioned on top of the DUT PCB and operably contained within the environmental chamber; the view also showing the actuator configured to press down on the device under test.
Figure 4:
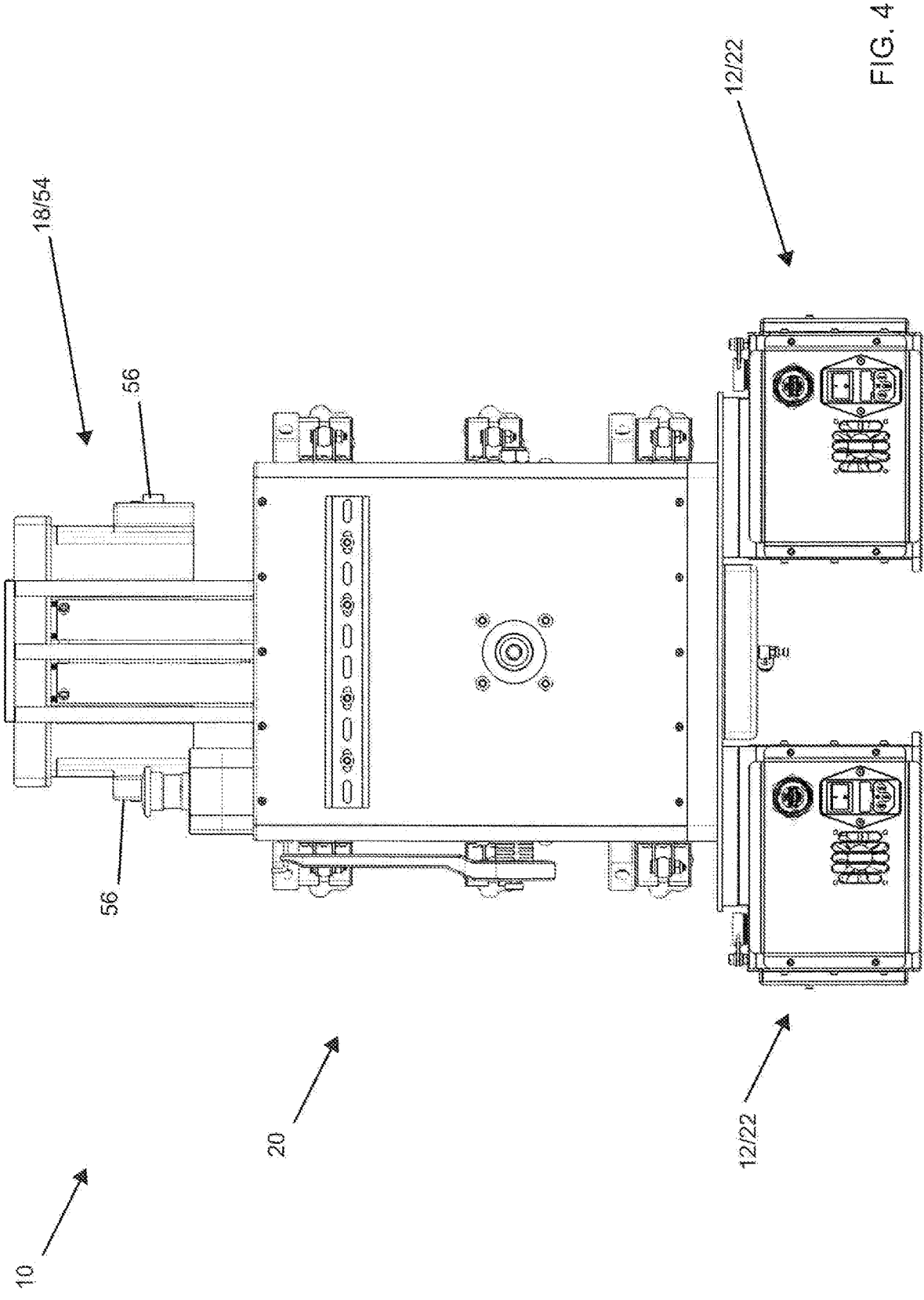
FIG. 4 is a rear elevation view of the testing system, the view showing an electrical interconnect testing device formed of two testing modules, a DUT PCB resting on top of the testing modules and spanning between the testing modules, an environmental chamber on top of the DUT PCB, and an actuator configured to press down on a device under test.
Figure 6:
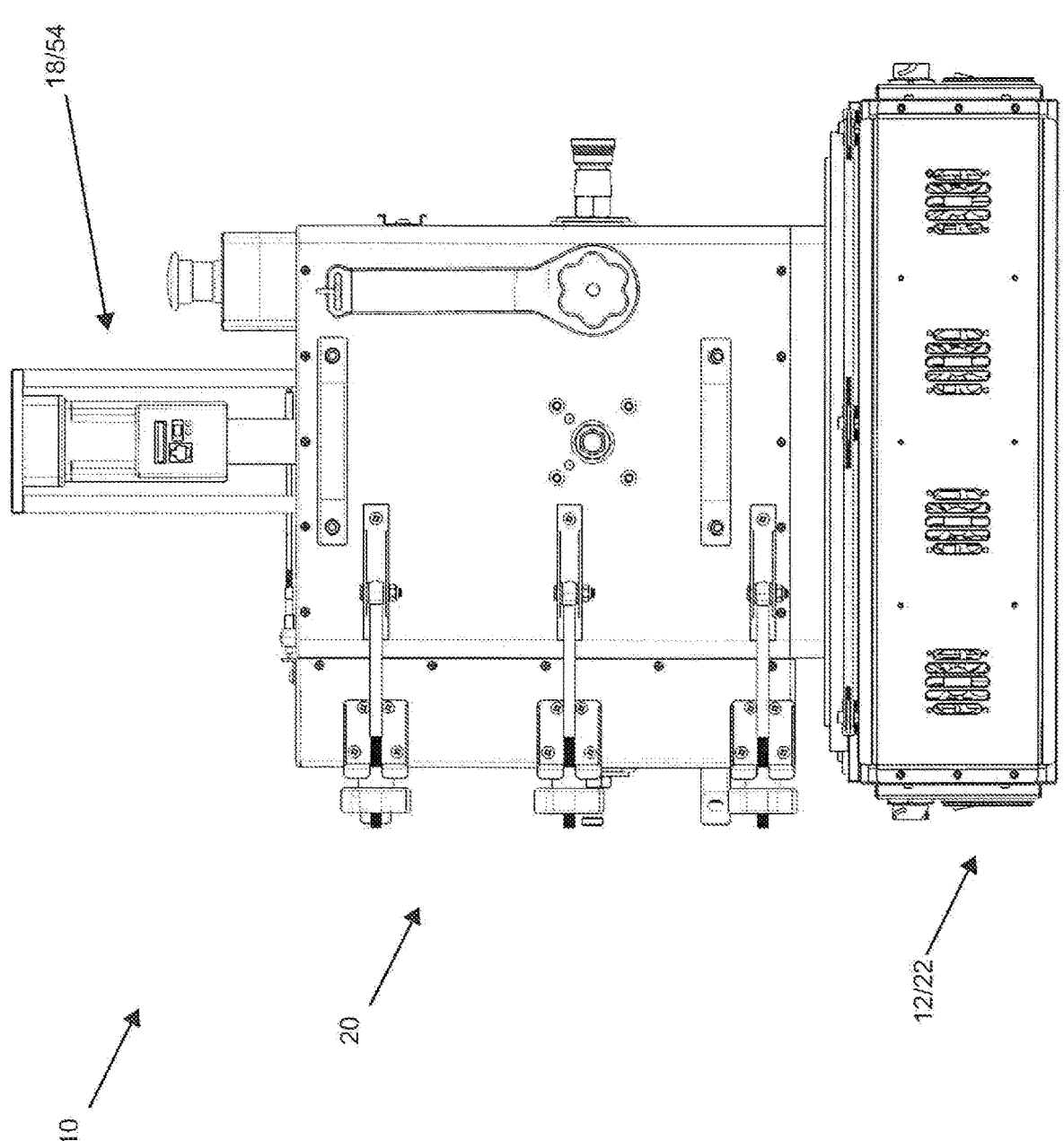
FIG. 6 a right elevation view of the testing system, the view showing an electrical interconnect testing device, a DUT PCB resting on top of the electrical interconnect testing device, an environmental chamber on top of the DUT PCB, and an actuator configured to press down on a device under test.
Figure 7:
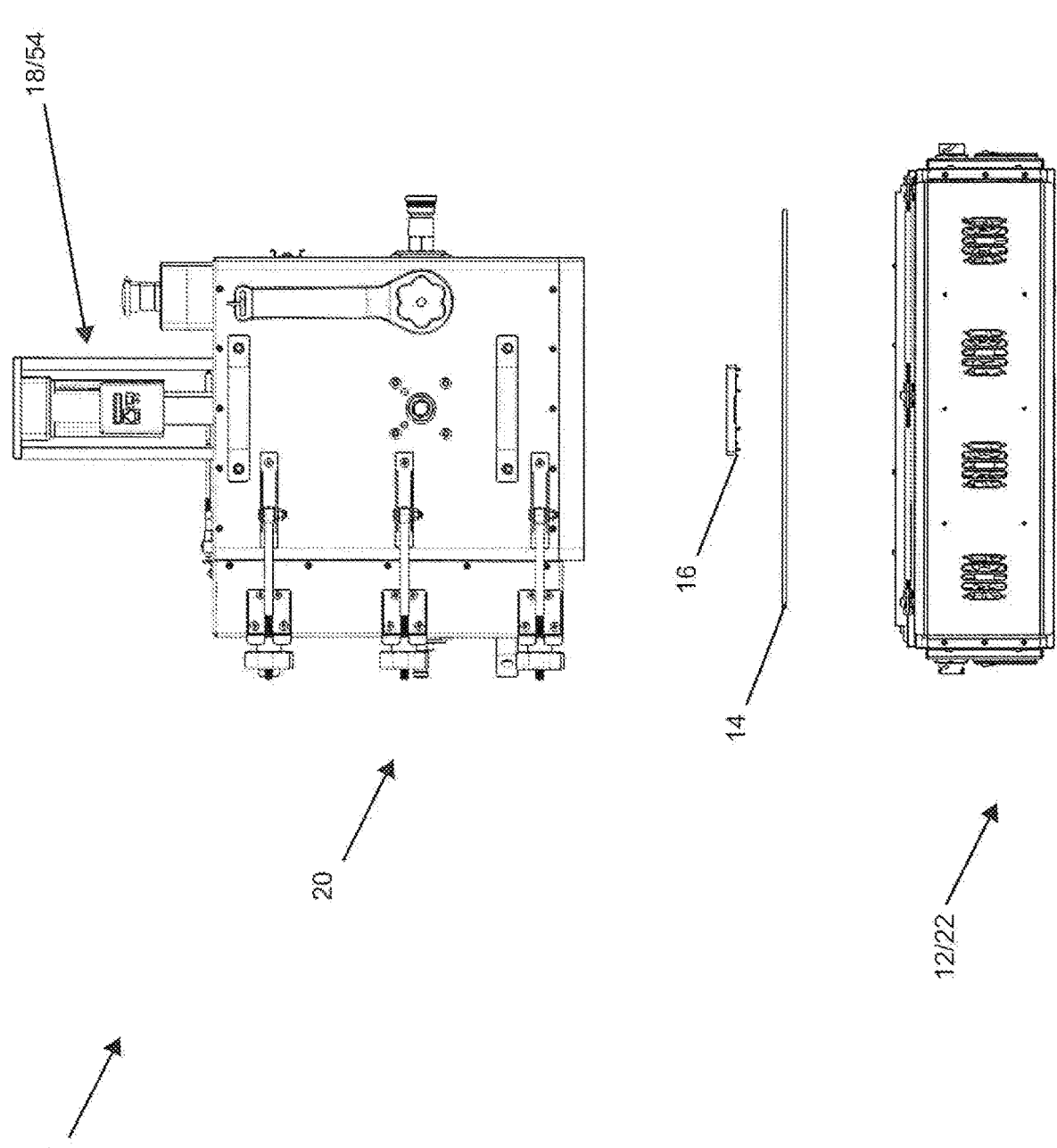
FIG. 7 is an exploded right view of the testing system, the view showing an electrical interconnect testing device, a DUT PCB, an electrical interconnect, an environmental chamber, and an actuator connected to the environmental chamber.
Figure 8:
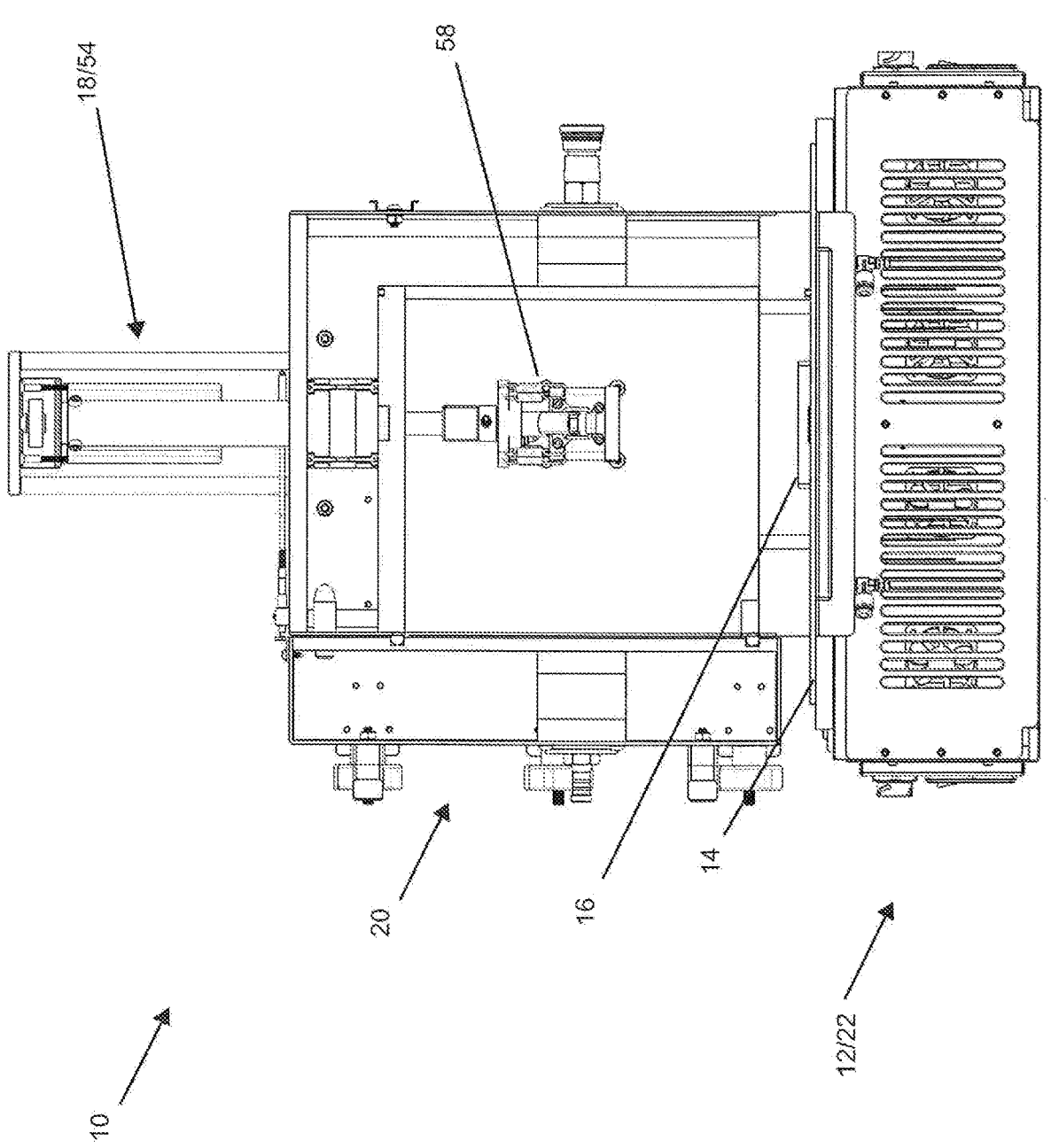
FIG. 8 is a right section view of the testing system, the view showing an electrical interconnect testing device, a DUT PCB resting on top of the electrical interconnect testing device, and an electrical interconnect on top of the DUT PCB and operably contained within the environmental chamber; the view also showing the actuator configured to press down on a device under test.
Figure 9:
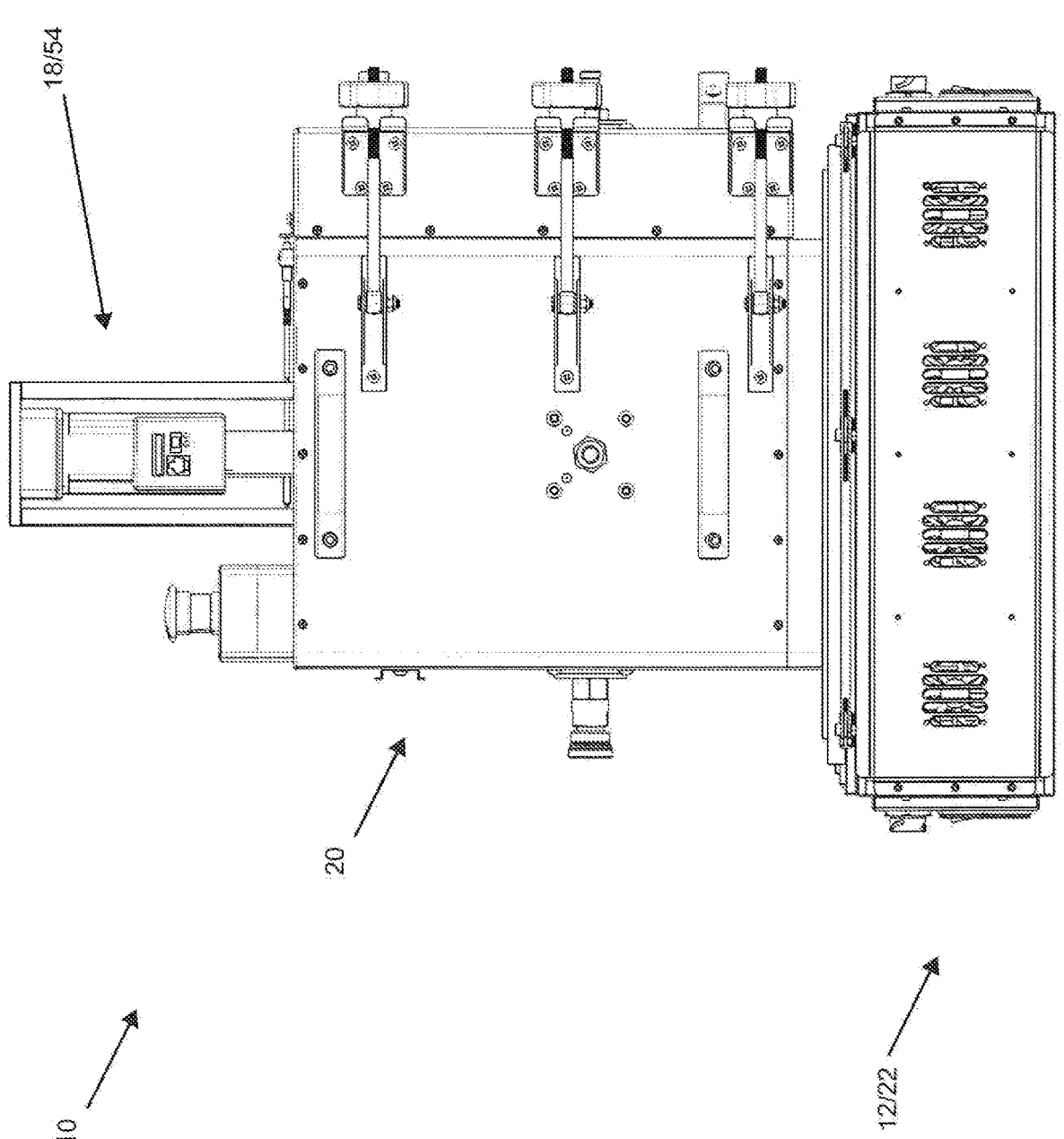
FIG. 9 is a left elevation view of the testing system, the view showing an electrical interconnect testing device, a DUT PCB resting on top of the electrical interconnect testing device, an environmental chamber on top of the DUT PCB, and an actuator configured to press down on a device under test.
Figure 10:
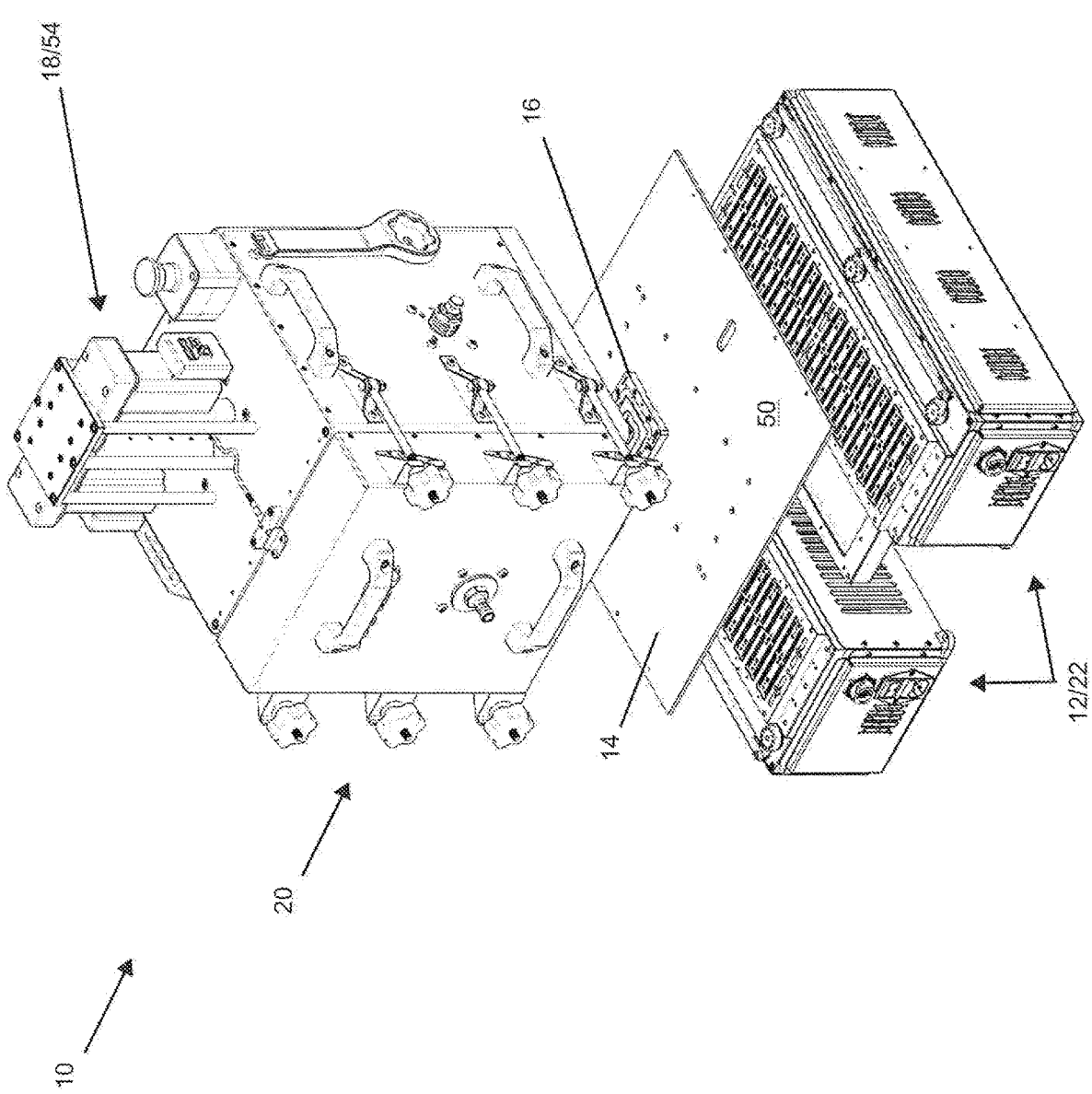
FIG. 10 is a perspective exploded view of the testing system, the view showing an electrical interconnect testing device formed of two testing modules, a DUT PCB, an electrical interconnect, an environmental chamber, and an actuator connected to the environmental chamber.
Figure 11:
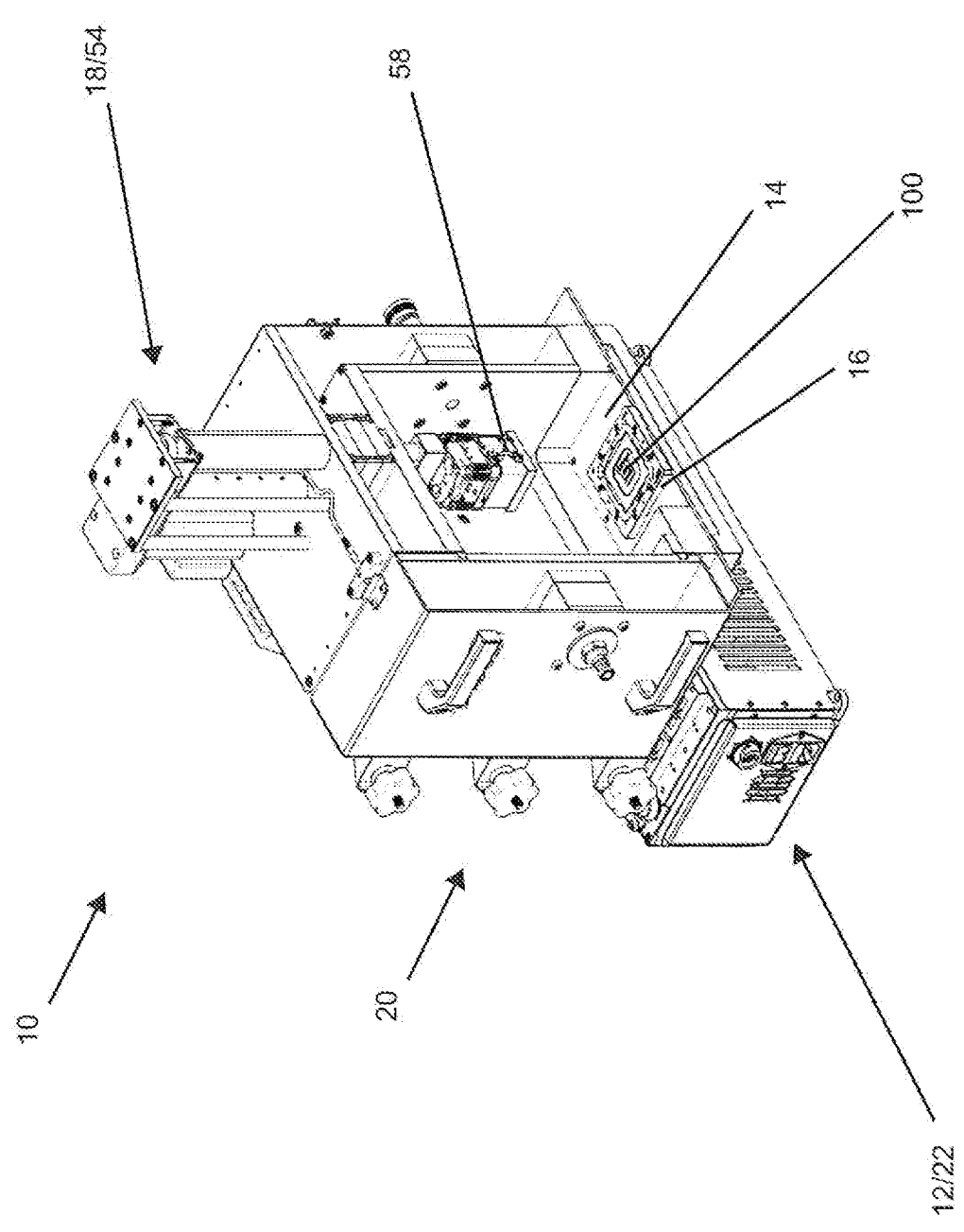
FIG. 11 is a perspective section view of the testing system, the view showing an electrical interconnect testing device, a DUT PCB having an electrical interconnect and a device under test resting on top of the electrical interconnect, and an environmental chamber; the view also showing the actuator configured to press down on the device under test.
Figure 12:
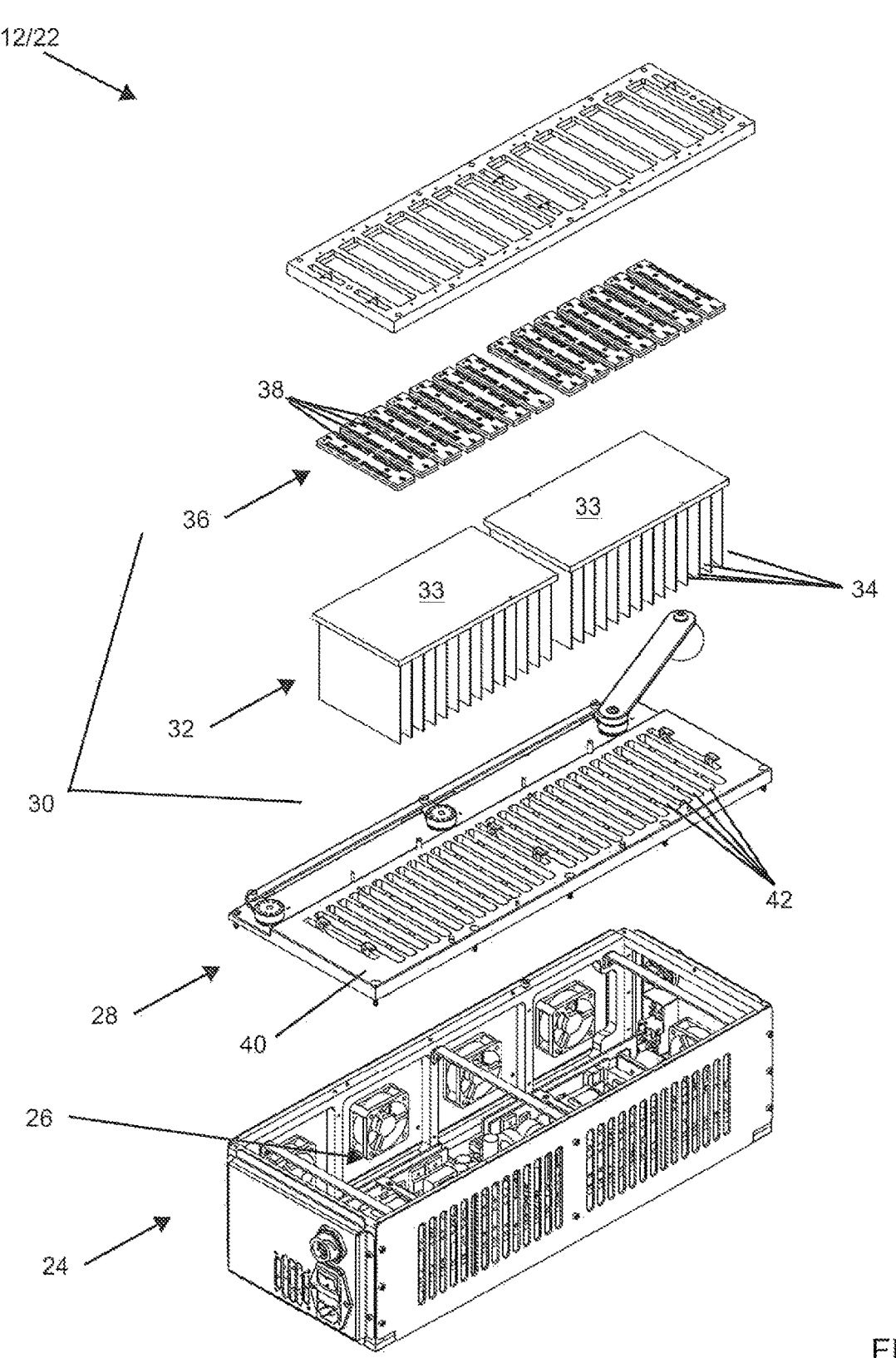
FIG. 12 is an exploded view of one embodiment of an electrical interconnect testing device; the view showing the electrical interconnect testing device having a housing with a hollow interior, a socket plate, and electronic testing components including capsules and a motherboard with card assemblies.
Figure 13:
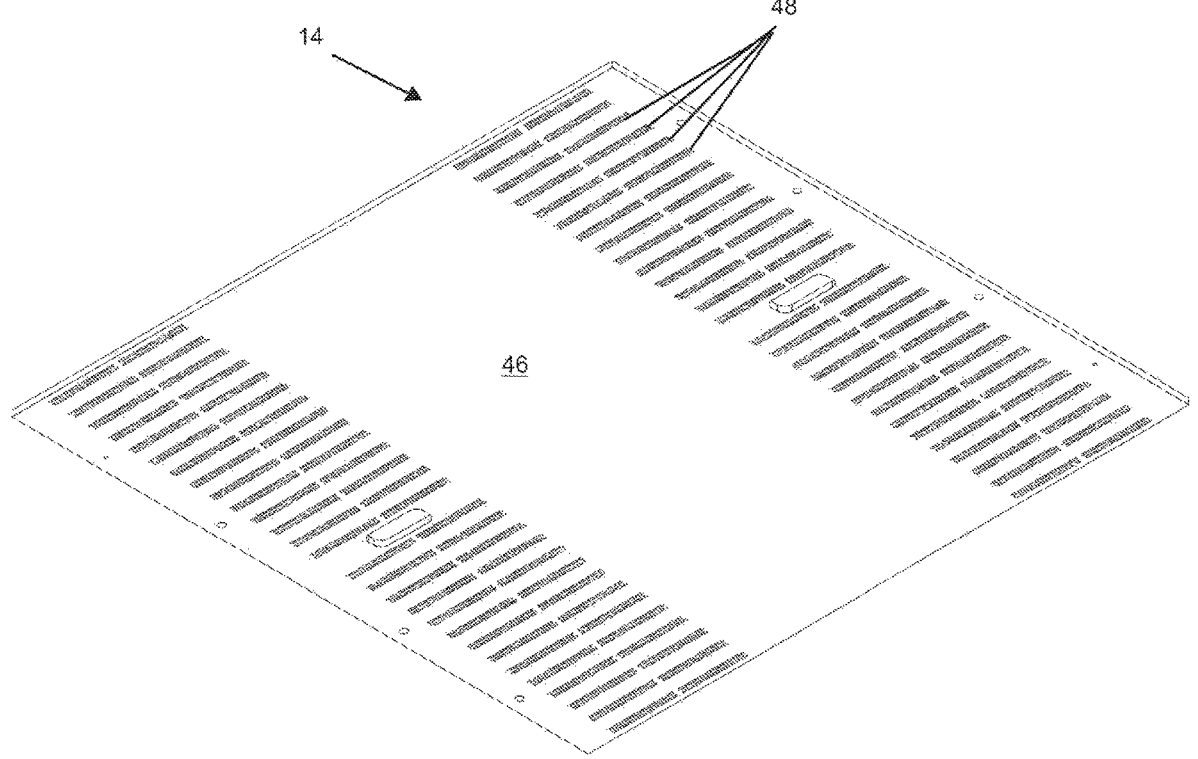
FIG. 13 is a perspective view of one embodiment of a device under test printed circuit board (DUT PCB); the view showing the lower surface of the DUT PCB with electrical contacts on the lower surface.

In the following detailed description of the embodiments, reference is made to the accompanying drawings which form a part hereof, and in which is shown by way of illustration specific embodiments in which the disclosure may be practiced. The embodiments of the present disclosure described below are not intended to be exhaustive or to limit the disclosure to the precise forms in the following detailed description. Rather, the embodiments are chosen and described so that others skilled in the art may appreciate and understand the principles and practices of the present disclosure. It will be understood by those skilled in the art that various changes in form and details may be made without departing from the principles and scope of the invention. It is intended to cover various modifications and similar arrangements and procedures, and the scope of the appended claims therefore should be accorded the broadest interpretation so as to encompass all such modifications and similar arrangements and procedures. For instance, although aspects and features may be illustrated in or described with reference to certain figures or embodiments, it will be appreciated that features from one figure or embodiment may be combined with features of another figure or embodiment even though the combination is not explicitly shown or explicitly described as a combination. In the depicted embodiments, like reference numbers refer to like elements throughout the various drawings.

It should be understood that any advantages and/or improvements discussed herein may not be provided by various disclosed embodiments, or implementations thereof. The contemplated embodiments are not so limited and should not be interpreted as being restricted to embodiments which provide such advantages or improvements. Similarly, it should be understood that various embodiments may not address all or any objects of the disclosure or objects of the invention that may be described herein. The contemplated embodiments are not so limited and should not be interpreted as being restricted to embodiments which address such objects of the disclosure or invention. Furthermore, although some disclosed embodiments may be described relative to specific materials, embodiments are not limited to the specific materials or apparatuses but only to their specific characteristics and capabilities and other materials and apparatuses can be substituted as is well understood by those skilled in the art in view of the present disclosure.

It is to be understood that the terms such as left, right, top, bottom, front, back, side, height, length, width, upper, lower, interior, exterior, inner, outer, and the like as may be used herein, merely describe points of reference and do not limit the present invention to any particular orientation or configuration.

As used herein, "and/or" includes all combinations of one or more of the associated listed items, such that "A and/or B" includes "A but not B," "B but not A," and "A as well as B," unless it is clearly indicated that only a single item, subgroup of items, or all items are present. The use of "etc." is defined as "et cetera" and indicates the inclusion of all other elements belonging to the same group of the preceding items, in any "and/or" combination(s).

As used herein, the singular forms "a," "an," and "the" are intended to include both the singular and plural forms, unless the language explicitly indicates otherwise. Indefinite articles like "a" and "an" introduce or refer to any modified term, both previously-introduced and not, while definite articles like "the" refer to a same previously-introduced term; as such, it is understood that "a" or "an" modify items that are permitted to be previously-introduced or new, while definite articles modify an item that is the same as immediately previously presented. It will be further understood that the terms "comprises," "comprising," "includes," and/or "including," when used herein, specify the presence of stated features, characteristics, steps, operations, elements, and/or components, but do not themselves preclude the presence or addition of one or more other features, characteristics, steps, operations, elements, components, and/or groups thereof, unless expressly indicated otherwise. For example, if an embodiment of a system is described as comprising an article, it is understood the system is not limited to a single instance of the article unless expressly indicated otherwise, even if elsewhere another embodiment of the system is described as comprising a plurality of articles.

It will be understood that when an element is referred to as being "connected," "coupled," "mated," "attached," "fixed," etc. to another element, it can be directly connected to the other element, and/or intervening elements may be present. In contrast, when an element is referred to as being "directly connected," "directly coupled," "directly engaged" etc. to another element, there are no intervening elements present. Other words used to describe the relationship between elements should be interpreted in a like fashion (e.g., "between" versus "directly between," "adjacent" versus "directly adjacent," "engaged" versus "directly engaged," etc.). Similarly, a term such as "operatively", such as when used as "operatively connected" or "operatively engaged" is to be interpreted as connected or engaged, respectively, in any manner that facilitates operation, which may include being directly connected, indirectly connected, electronically connected, wirelessly connected or connected by any other manner, method or means that facilitates desired operation. Similarly, a term such as "communicatively connected" includes all variations of information exchange and routing between two electronic devices, including intermediary devices, networks, etc., connected wirelessly or not. Similarly, "connected" or other similar language particularly for electronic components is intended to mean connected by any means, either directly or indirectly, wired and/or wirelessly, such that electricity and/or information may be transmitted between the components.

It will be understood that, although the ordinal terms "first," "second," etc. may be used herein to describe various elements, these elements should not be limited to any order by these terms unless specifically stated as such. These terms are used only to distinguish one element from another; where there are "second" or higher ordinals, there merely must be a number of elements, without necessarily any difference or other relationship. For example, a first element could be termed a second element, and, similarly, a second element could be termed a first element, without departing from the scope of example embodiments or methods.

Similarly, the structures and operations discussed herein may occur out of the order described and/or noted in the figures. For example, two operations and/or figures shown in succession may in fact be executed concurrently or may sometimes be executed in the reverse order, depending upon the functionality/acts involved. Similarly, individual operations within example methods described below may be executed repetitively, individually or sequentially, to provide looping or other series of operations aside from single operations described below. It should be presumed that any embodiment or method having features and functionality described below, in any workable combination, falls within the scope of example embodiments.

Testing System

With reference to the figures, a testing system (or simply "system 10") is presented. System 10 is formed of any suitable size, shape, and design and is configured to facilitate testing of device under test ("DUT") 100, electrical interconnects (such as test sockets), and/or device under test printed circuit boards ("DUT PCBs"). In the arrangement shown, as one example, system 10 includes an electrical interconnect testing device 12, a DUT PCB 14, an electrical interconnect 16, a cycler system 18, and an environmental chamber 20, among other components as are described or incorporated by reference herein. While system 10 has been described according to the arrangement shown, as one example, any combination or arrangement may be used and is hereby contemplated for use.

Electrical Interconnect Testing Device 12:

In the arrangement shown, as one example, system 10 may be formed using an electrical interconnect testing device 12. Electrical interconnect testing device 12 is formed of any suitable size, shape, and design and is configured to facilitate testing of DUTs, electrical interconnects, and/or DUT PCBs. In one or more arrangements, as examples, electrical interconnect testing device 12 may be formed of one or more testing modules 22. In one or more arrangements, as one example, electrical interconnect testing device 12 includes, among other components, a housing 24 (or frame) with a hollow interior 26, a socket plate 28 connected to the housing 24, and electrical testing components 30 operably connected to the socket plate 28 and contained within the hollow interior 26 of housing 24. In one or more arrangements, as one example, electrical interconnect testing device 12 may be the testing modules shown and described in the following, the entireties of which are hereby incorporated by reference: U.S. application Ser. No. 17/835,620, filed on Jun. 8, 2022, entitled "MODULAR ELECTRONIC TESTNIG SYSTEM WITH FLEXIBLE TEST PCB FORMAT" (hereinafter "the '620 application"); and/or U.S. application Ser. No. 16/983,309, filed on Aug. 3, 2020, entitled "'MODULAR ELECTRONIC TESTING SYSTEM WITH FLEXIBLE TEST PCB FORMAT", and granted as U.S. Pat. No. 11,385,277 (hereinafter "the '277 patent"). In various alternative arrangements, the electrical interconnect testing device 12 may be the testing systems shown and described in the following, the entireties of which are hereby incorporated by reference: U.S. application Ser. No. 17/712, 392 filed on Apr. 4, 2022 entitled "FORCE DEFLECTION AND RESISTANCE TESTING SYSTEM AND METHOD OF USE" (hereinafter "the '392 application"); U.S. application Ser. No. 16/882,917 filed on May 26, 2020 entitled "FORCE DEFLECTION AND RESISTANCE TESTING SYSTEM AND METHOD OF USE", and granted as U.S. Pat. No. 11,313,880 (hereinafter "the '880 patent"); U.S. application Ser. No. 16/181,846 filed on Nov. 6, 2018 entitled "FORCE DEFLECTION AND RESISTANCE TESTING SYSTEM AND METHOD OF USE", and granted as U.S. Pat. No. 10,705,120 (hereinafter "the '120 patent"); U.S. application Ser. No. 15/462,383 filed on Mar. 17, 2017 entitled "FORCE DEFLECTION AND RESISTANCE TESTING SYSTEM AND METHOD OF USE", and granted as U.S. Pat. No. 10,156,586 (hereinafter "the '586 patent"); and/or U.S. application Ser. No. 14/996,045 filed on Jul. 14, 2016 entitled "QUICK CHANGE SMALL FOOTPRINT TESTING SYSTEM AND METHOD OF USE", and granted as U.S. Pat. No. 9,885,737 (hereinafter "the '737 patent").

Housing 24: In the arrangement shown, as one example, electrical interconnect testing device 12 includes a housing 24. Housing 24 is formed of any suitable size, shape, and design and is configured to house, hold, shelter, secure, and support various components of system 10. In the arrangement shown, as one example, housing 24 is generally rectangular in shape and forms a generally hollow interior 26. Hollow interior 26 is formed of any suitable size, shape, and design and is configured to house various components of system 10, including electronic testing components 30. In various alternative arrangements, housing 24 may be the housing described in the '620 application and/or the '277 patent, or housing 24 may be the frame member described in the '392 application, the '880 patent, the '120 patent; the '586 patent; and/or the '737 patent. However, it will be understood by those skilled in the art that any other configuration of housing 24 may be used, and is hereby contemplated for use, in order to house, hold, shelter, secure, and support various components of system 10.

Socket Plate 28: In the arrangement shown, as one example, electrical interconnect testing device 12 includes socket plate 28. Socket plate 28 is formed of any suitable size, shape, and design and is configured to connect to the upper end of housing 24, thereby enclosing the hollow interior 26 of housing 24, as well as provide support for electrical testing components 30, among other features and functionalities. In the arrangement shown, as one example, socket plate 28 is a generally planar member having a generally flat upper surface 40 and a plurality of sockets 42 extending through socket plate 28 from the upper surface 40 to its lower surface (not pictured). Sockets 42 are formed of any suitable size, shape, and design and are configured to allow for certain electrical components to extend through socket plate 28 and into the hollow interior 26 of housing 24 while the upper surface 40 of socket plate 28 provides support to the electrical testing components 30.

In various arrangements, socket plate 28 may be those socket plates shown and described in any of the following: the '620 application; the '277 patent; the '392 application, the '880 patent, the '120 patent; the '586 patent; and/or the '737 patent. However, it will be understood by those skilled in the art that any other configuration of socket plate 28 may be used, and is hereby contemplated for use, in order to connect to the upper end of housing 24, thereby enclosing the hollow interior 26, as well as provide support for electrical testing components 30.

Electrical Testing Components 30: In one or more arrangements, as one example, electrical interconnect testing device 12 includes electrical testing components 30. Electrical testing components 30 are formed of any suitable size, shape, and design and are configured to facilitate testing of DUTs, electrical interconnects, and/or DUT PCBs. In one or more arrangements, electrical testing components 30 may include card assemblies 32 having a motherboard 33 and electrical testing boards 34, and capsules 36 having compressible electrical contacts 38. In this arrangement, as one example, the compressible electrical contacts 38 on the top side of the capsules 36 connect to the electrical contacts 48 on the lower surface 46 of the DUT PCB 14, and the compressible electrical contacts 38 on the bottom side of capsules 36 connect to the motherboard 33 of card assemblies 32, thereby operably connecting DUT PCB 14 to the electrical testing components 30.

In various arrangements, electrical testing components 30 may be those electrical testing components described in any of the following: the '620 application; the '277 patent; the '392 application, the '880 patent, the '120 patent; the '586 patent; and/or the '737 patent. However, it will be understood by those skilled in the art that any other combination and configuration of electrical testing components 30 may be used, and is hereby contemplated for use, in order to facilitate testing of DUTs, electrical interconnects, and/or DUT PCBs.

While electrical interconnect testing device 12, and various components of electrical interconnect testing device 12, have been shown, described, and/or incorporated by reference herein, electrical interconnect testing device 12 and its various components are not so limited. Rather, it will be understood by those skilled in the art that any other combination of components and any other configuration of electrical interconnect testing device 12 and its various components may be used in order to facilitate testing of DUTs, electrical interconnects, and/or DUT PCBs.

DUT PCB 14:

In the arrangement shown, as one example, system 10 includes DUT PCB 14. DUT PCB 14 is formed of any suitable size, shape, and design and is configured to operably connect to electrical interconnect 16 and electrical testing components 30 of electrical interconnect testing device 12, and thereby operably connecting electrical interconnect 16 to electrical testing components 30. In the arrangement shown, as one example, DUT PCB 14 includes a lower surface 46 with electrical contacts 48, and a top surface 50. In this arrangement, as one example, the electrical contacts 48 in the lower surface 46 of DUT PCB 14 connect with the compressible electrical contacts 38 of capsules 36 of electrical testing components 30, thereby operably connecting the DUT PCB 14 to the electrical testing components 30. Additional, in this arrangement as one example, the electrical interconnect 16 is configured to connect to the top surface 50 of DUT PCB 14 such that electrical interconnect 16 is in operable electrical connection with the electrical contacts 48 in the lower surface 46 of DUT PCB 14, and in this way DUT PCB 14 facilitates connection between electrical interconnect 16 and electrical testing components 30.

In various arrangements, DUT PCB 14 may be those DUT PCBs shown and described in any of the following: the '620 application; the '277 patent; the '392 application, the '880 patent, the '120 patent; the '586 patent; and/or the '737 patent. However, it will be understood by those skilled in the art that any other configuration of DUT PCBs, and any other printed circuit board, may be used, and is hereby contemplated for use, in order to operably connect to electrical interconnect 16 and electrical testing components 30 of testing module(s) 12, thereby operably connecting electrical interconnect 16 to electrical testing components 30.

Electrical Interconnect 16:

In the arrangement shown, as one example, system 10 includes an electrical interconnect 16. Electrical interconnect 16 is formed of any suitable size, shape, and design and is configured to connect to the top surface 50 of DUT PCB 14 and receive DUT 100 (such as a semiconductor chip, a reference ship, a shorting device, a reference standard, or the like) or any other form of a device simulator. In the arrangement shown, as one example, electrical interconnect 16 is a testing socket, however any other type of electrical interconnect may be used as electrical interconnect 16. In the arrangement shown, as one example, electrical interconnect 16 is connected to the top surface 50 of DUT PCB 14 through the use of fasteners such as screws. In the arrangement shown, as one example, with electrical interconnect 16 connected to the top surface 50 of DUT PCB 14, electrical interconnect 16 is operably connected to electrical testing components 30 through DUT PCB 14. In the arrangement shown, as one example, when DUT 100 is received and held within electrical interconnect 16 and pushed down into electrical interconnect 16, DUT 100 is in operable electrical connection with electrical interconnect 16 and, more specifically, the plurality of electrical contacts (not shown) of electrical interconnect 16. When DUT 100 is in contact with the plurality of electrical contacts of electrical interconnect 16, DUT 100 is also in operably electrical connection with electrical testing components 30. In this way, electrical interconnect 16 operably connects DUT 100 to electrical testing components 30.

In various arrangements, electrical interconnect 16 may be those electric interconnects or test sockets shown and described in any of the following: the '620 application; the '277 patent; the '392 application, the '880 patent, the '120 patent; the '586 patent; and/or the '737 patent. However, it will be understood by those skilled in the art that any other type or configuration of electrical interconnect 16 may be used, and is hereby contemplated for use, in order to connect to the top surface 50 of DUT PCB 14, receive DUT 100, and facilitate the operably connection between DUT 100 and electrical testing components 30.

Cycler System 18:

In the arrangement shown, as one example, system 10 includes a cycler system 18. Cycler system 18 is formed of any suitable size, shape, and design and is configured to provide repeatable and reproducible tests and/or measurements of DUT 100, electrical interconnect 16, and/or DUT PCB 14. In the arrangement shown, as one example, cycler system 18 includes an actuator 54. Actuator 54 is formed of any suitable size, shape, and design and facilitates vertical movement so as to press DUT 100 into electrical interconnect 16. In the arrangement shown, as one example, actuator 54 includes two motors 56 configured to provide power to actuator 54. In the arrangement shown, as one example, actuator 54 also includes a pusher 58 at its bottom end, which is configured to contact DUT 100 and press down on DUT 100.

In various arrangements, cycler system 18 and actuator 54 may be the cycler system and actuator, respectively, shown and described in any of the following: the '392 application, the '880 patent, the '120 patent; the '586 patent; and/or the '737 patent. However, it will be understood by those skilled in the art that any other type or configuration of actuator 54 may be used, and is hereby contemplated for use, in order to facilitate vertical movement so as to press DUT 100 into electrical interconnect 16. Further, it will be understood by those skilled in the art that any other type or configured of cycler system 18 may be used, and is hereby contemplated for use, in order to provide repeatable and reproducible tests and/or measurements of DUT 100, electrical interconnect 16, and/or DUT PCB 14.

Environmental Chamber 20:

In the arrangement shown, as one example, system 10 includes an environmental chamber 20. Environmental chamber 20 is formed of any suitable size, shape, and design and is configured to operably receive and contain DUT 100, electrical interconnect 16, and/or DUT PCB 14 within environmental chamber 20 and provide a controlled environment for testing DUT 100, electrical interconnect 16, and/or DUT PCB 14. In the arrangement shown, as one example, the primary purpose of the environmental chamber 20 is to control the temperature at which testing is performed, however environmental chamber 20 may be used to control any number of other conditions including, but not limited to, humidity, air pressure, gas, air quality, and the like. In the arrangement shown, as one example, environmental chamber 20 is a generally box shaped member with a hollow interior.

In the arrangement shown, as one example, environmental chamber 20 includes openings (not shown) which allow the pusher 58 of actuator 54 to be located in the interior of environmental chamber 20, while the motors 56 of actuator 54 are located on the exterior of environmental chamber 20. In the arrangement shown, as one example, the environmental chamber 20 is configured to be placed on the top surface 50 of DUT PCB 14, or on the top surface of any member extending above DUT PCB 14 in various arrangements, such as a top plate positioned on top of DUT PCB 14 for one or more embodiments of electrical interconnect testing device 12. In this arrangement, the electrical interconnect 16 and environmental chamber 20 are positioned such that the electrical interconnect 16 is operably contained within the environmental chamber 20 when environmental chamber is placed on the top surface 50 of DUT PCB 14 (or the top surface of any other member extending above DUT PCB 14), thereby allowing testing to be conducted under specified conditions, such as extreme high and/or low temperature. Any temperature range is hereby contemplated for use. In one or more arrangements, a high temperature is considered significantly above ambient temperature and a low temperature is considered significantly below ambient. In another arrangement a range of −55 C to 155 C is contemplated, as is another range of −80 C to 225 C, and, again, any other range is hereby contemplated for use. In one or more arrangements a temperature range of below freezing on the low end to above boiling on the high end is contemplated. In one or more arrangements, a temperature range is utilized from established automotive equipment testing standards, military equipment testing standards, aerospace equipment testing standards, and/or any other established testing standard.

Assembly:

System 10, and its various components, may be assembled as shown and described in any of the following: the '620 application; the '277 patent; the '392 application, the '880 patent, the '120 patent; the '586 patent; and/or the '737 patent. Generally, in the arrangement shown as one example, electrical interconnect testing device 12 if provided, with each electrical interconnect testing device 12 having a housing 24 having a hollow interior 26, a socket plate 28 connected to the top end of housing 24, thereby enclosing hollow interior 26, electronic testing components 30 which are supported by socket plate 28 and particularly extend through socket plate 28 and into the hollow interior 26 of housing 24. In the arrangement shown, as one example, electronic testing components 30 include card assemblies 32 having a motherboard 33 which rests on top of socket plate 28, and electrical testing boards 34 which extend into the hollow interior 26 of housing 24. Capsules 36 are then connected to the top surface of motherboard 33, thereby connecting capsules 36 to card assemblies 32. DUT PCB 14 is then placed on top of the electrical interconnect testing device 12 such that the electrical contacts 48 in the lower surface 46 of DUT PCB 14 are in operably connection with the compressible electrical contacts 38 of capsules 36.

Before or after DUT PCB 14 is placed onto the testing modules 12, an electrical interconnect 16 may be connected to the top surface 50 of DUT PCB 14 by fasteners such as screws. Once electrical interconnect 16 is connected to the DUT PCB 14 and the electrical contacts 48 of DUT PCB 14 are operably connected to the compressible electrical contacts 38 of capsules 36, the electrical interconnect 16 and electrical testing components 30 are operably connected and a DUT 100 is ready to be tested. To test the DUT 100, the DUT 100 is placed onto the electrical interconnect 16 and the environmental chamber 20 is placed onto the top surface 50 of the DUT PCB 14 and positioned such that the pusher 58 of actuator 54 of cycler system 18 is positioned directly over the DUT 100. Once the environmental chamber 20 is at the desired condition (i.e. the desired temperature), the actuator 54 may be moved down such that the pusher 58 contacts DUT 100 and pushes DUT 100 into the electrical interconnect 16. With DUT 100 pushed into the electrical interconnect 16, DUT 100 is operably connected to the electrical testing components 30 and tests may be run on DUT 100, electrical interconnect 16, and/or DUT PCB 14.

Method of Use:

As one example, system 10 may be used to test DUTs 100, electrical interconnects 16, and/or DUT PCBs 14. The method of using system 10 may be the method of use presented in the '392 application, the '880 patent, the '120 patent, the '586 patent, and/or the '737 patent, with the added step of adjusting temperature within environmental chamber 20 in order to test DUTs 100, electrical interconnects 16, and/or DUT PCBs 14 under desired temperature conditions.

Without limiting the foregoing, generally the method of testing of DUTs 100, electrical interconnects 16, and/or DUT PCBs 14 presented is shown in FIG. 14. First, at Step 1, DUT 100 will be placed into electrical interconnect 16, thereby operably connecting DUT 100 to the electrical testing components 30 within electrical interconnect testing device 12. Next, at Step 2, the environmental chamber 20 will be placed onto the top surface of DUT PCB 14 such that DUT 100 is positioned directly under pusher 58 of actuator 54 and, at Step 3, the temperature within environmental chamber 20 will be set to a first desired temperature. Once environmental chamber 20 is at the first desired temperature, at Step 4 a user will need to determine whether tests will be conducted by pressing down DUT 100 with a plurality of different levels of force or pressing DUT 100 down to a plurality of different positions by moving actuator 54 down a plurality of increments. With this decision made, actuator 54 will then press down on DUT 100 with either a plurality of different levels of force at Step 5A, or at Step 5B actuator 54 will be moved down a plurality of increments, thereby moving DUT 100 to a plurality of different positions. At Step 6, at least one measurement of at least one electrical property will be taken while steps 5A or 5B are taking place. With the first round of measurements taken, an optional Step 7 can be conducted by adjusting the temperature within environmental chamber 20 to a second desired temperature and repeating steps 4 through 6. Additionally, this method of use shown in FIG. 14 may be repeated as many times as desired in order to provide statistically improved results. Further, the measurements taken from these tests may be output and graphed.

The purpose of the environmental chamber 20 is to facilitate the performance of force, deflection and resistance testing, as well as any other types of testing, under temperatures well above ambient and well below ambient. The reason for this is that the material properties of the electrical interconnect 16 (as well as device under test 100 and any other component for that matter) change as the temperature changes and many chips (device under test 100) are required to be tested at extreme high temperatures and extreme low temperatures so as to qualify for use in various applications such as automotive, marine, military, aerospace and the like. Because the chips (device under test 100) must be tested at extreme temperatures, the electrical interconnects 16 are similarly exposed to these extreme temperatures. And as the temperature changes, the physical properties of electrical interconnect 16 changes, which effect testing results unless properly characterized. That is, the same test can be performed at different temperatures yielding different results, which is a result of the change in temperature. As one example, the springs of electrical interconnect 16 can get stiffer as the temperature gets colder, and conversely, the springs of electrical interconnect 16 can get softer as the temperature gets warmer. Using environmental chamber 20 to characterize the changes in electrical interconnect 16 allows for a better understanding of the performance of electrical interconnect 16 at different temperatures and therefor allows more precise and accurate testing processes and procedures.

Method of Testing:

Without limiting the foregoing, in one or more arrangements, as one example, testing may be done as follows. In this arrangement, as one example, electrical interconnect testing device 12 is attached to cycler system 18 and is positioned generally under actuator 54. In this position, the actuator 54 moves over electrical interconnect testing device 12 in the X-direction as it slides on rails of cycler system 18.

The proper DUT PCB 14 is placed on the electrical interconnect testing device 12 and the desired electrical interconnect 16 is attached to the top surface 50 of DUT PCB 14. Care is taken when attaching the electrical interconnect 16 to the DUT PCB 14 such that electrical interconnect 16 electrically connects to electrical contacts 48 of the DUT PCB 14. Once in this position, the electrical interconnect 16 is tightened in place using fasteners that extend through openings in the electrical interconnect 16 and into the DUT PCB 14. In this position, the electrical interconnect 16 is electrically connected to the electrical testing boards 34 of card assemblies 32 of electronic testing components 30 of electrical interconnect testing device 12.

Next, a device under test 100 is placed in the electrical interconnect 16. As the device under test 100 is placed within the electrical interconnect 16, the raised peripheral edges of the electrical interconnect 16 help guide the device under test 100 into alignment such that the device under test 100 and electrical interconnect 16 are, theoretically, electrically connected. However, in practice, due to countless variables, such as dimensional variation, contamination, oxidation, etc., the device under test 100 must be pressed into the electrical interconnect 16 a distance or with an amount of force to be electrically connected to the electrical interconnect 16. As the device under test 100 is pressed into the electrical interconnect 16 the device under test 100 and electrically interconnect 16 form an electrically conductive connection. In this position, the device under test 100 and electrical interconnect 16 are electrically connected to the electrical testing boards 34 of card assemblies 32 of electronic testing components 30 of electrical interconnect testing device 12.

If the device under test 100 is not moved down far enough, or if enough force is not applied to the device under test 100 then the potential exists that not all of the contact points of the electrical interconnect 16 will engage the contact points device under test 100, this is due to varying heights of the contact points of electrical interconnect 16 and/or varying heights of the contact points of device under test 100. Or, even if the contact points of the electrical interconnect 16 engage the contact points of the device under test 100, there may be contamination, oxidation or other reasons why an electrically conductive connection is not formed there between. It is for these reasons why a certain amount of additional force is applied, and the device under test 100 is moved downward into the electrical interconnect 16, to ensure that all of the electrical contacts of electrical interconnect 16 engage and form an electrically conductive connection with the electrical contacts of device under test 100.

As the device under test 100 is moved downward, the electrical contact points of the electrical interconnect 16 compress thereby taking up dimensional variance between the electrical interconnect 16 and the device under test 100. However, if the device under test 100 is driven too far into the electrical interconnect 16 the contact points of the electrical interconnect 16 will bottom out, at which point additional force could damage or destroy the electrical contact and/or the entire electrical interconnect 16.

The purpose of testing an electrical interconnect 16 is to determine whether the electrical interconnect 16 is adequately performing. If the electrical interconnect 16 is not adequately performing, meaning that the electrical contacts of electrical interconnect 16 are imparting excess resistance to the tests of the device under test 100 then, when used in production, semiconductor chips (an example of a device under test 100) are likely to be unnecessarily rejected or scrapped. As such, this can be a very costly error.

However, prior to utilizing the electrical interconnect testing device 12 and cycler system 18, there was no adequate or comprehensive way to test the electrical interconnect 16 to determine whether it was functioning properly, not to mention functioning optimally. Instead users of electrical interconnects 16 merely accepted the manufacturers specifications as to how much force to apply and/or how far to drive the device under test 100 into the electrical interconnect 16. Instead of accepting this information as a so-called "known" the electrical interconnect testing device 12 with cycler system 18 can be used to test the functioning of the electrical interconnect 16 throughout its operational range, and on one, some or all electrical contact points at a plurality of increments of a plurality of different levels of force.

Cycling: In one or more arrangements, cycler system 18 may be used to perform repeated tests on DUTs 100, electrical interconnects 16, and/or DUT PCBs 14. For instance, it may be advantageous to use cycler system 18 to press DUT 100 into electrical interconnect 16 many times and run repeated tests to determine the life cycle of an electrical interconnect 16. That is, in various arrangements a manufacturer may want to determine the life cycle of an electrical interconnect 16 to determine how many tests of DUTs 100 can be done using a single electrical interconnect 16. In various arrangements, to determine the life cycle of an electrical interconnect 16, cycler system 18 may be utilized to press a DUT 100 into an electrical interconnect 16 tens, hundreds, thousands, or more times. In this arrangement, as one example, electrical measurements of DUT 100 may be taken at any number of increments, such as every 10 times, 50 times, 100 times, 200 times, or 1,000 times that DUT 100 is pressed into electrical interconnect 16, or any other increment as well, in order to determine the performance of electrical interconnect 16 after that many instances of a DUT 100 being pressed into the electrical interconnect 16.

After a certain number of instances of DUT 100 being pressed into the electrical interconnect 16, the performance of electrical interconnect 16 may change and the electrical measurements of DUT 100 may indicate that the particular DUT 100 being tested may not be perform as expected. If the performance of electrical interconnect 16 is decreasing, good DUTs 100 may be discarded when it is actually the electrical interconnect 16 that is not performing properly or as it used to be tested. In various arrangements, as the electrical interconnect 16 continues to be used, it may be that the DUT 100 must be pressed down into electrical interconnect 16 harder and/or farther to get the proper contacts between DUT 100 and electrical interconnect 16. This ability to cycle through many tests and repetitions of pressing DUT 100 down into electrical interconnect 16 is important because if the DUT 100 has to be pressed harder to get proper contact between DUT 100 and electrical interconnect 16 after a certain number of intervals and this is not known, then good DUTs 100 (e.g. semiconductor chips) may be wrongfully discarded because the electrical interconnect 16 is nearing the end of its useful life. In the arrangement shown, as one example, cycler system 18 makes this cycle testing efficient, repeatable, easy, and relatively quick.

In one or more arrangements, as examples, cycler system 18 may perform any number of instances of pressing DUT 100 into electrical interconnect 16. As one example, cycler system 18 may be used to press DUT 100 into electrical interconnect 16 100,000 times, and electrical measurements of DUT 100 are taken every 1,000 times DUT 100 is pressed into electrical interconnect 16. In one or more arrangements, as one example, every 1,000th time DUT 100 is pressed into electrical interconnect 16, DUT 100 is pressed down into electrical interconnect 16 to a plurality of different positions and at least one measurement of at least one electrical property is taken while DUT 100 is pressed down to each of the plurality of different positions. Additionally or alternatively, as an example, every 1,000th time DUT 100 is pressed into electrical interconnect 16, DUT 100 is pressed down into electrical interconnect 16 with a plurality of different levels of force and at least one measurement of at least one electrical property is taken while DUT 100 is pressed down at the plurality of different levels of force. In further additional or alternative arrangements, as examples, an environmental chamber 20 may be used so that tests can be performed at various different temperatures. That is, additionally or alternatively, the cycle of pressing DUT 100 into electrical interconnect 16 may be done while DUT 100 and electrical interconnect 16 are operably within an environmental chamber 20 that is at a first temperature (which may be warmer than ambient temperature) a second temperature (which may be cooler than ambient temperature, and at any other number of different temperatures, and at least one measurement of at least one electrical property can be taken while environmental chamber 20 is at any temperature, or at various temperatures, and the DUT 100 is being pressed into electrical interconnect 16 at either or both of a plurality of different levels of force or a plurality of increments.

In one or more arrangements, as one example, the method of testing the electrical interconnect 16 comprises the following steps: providing an electrical interconnect testing device; providing an electrical interconnect; the electrical interconnect having a plurality of contact points; attaching the electrical interconnect to the electrical interconnect testing device; providing a device under test; aligning the device under test with the electrical interconnect; providing an environmental chamber; pressing the device under test into the electrical interconnect with a plurality of different levels of force; taking at least one measurement of at least one electrical property while the device under test is pressed with the plurality of different levels of force; wherein the step of pressing the device under test into the electrical interconnect with the plurality of different levels of force is repeated a number of times; wherein the step of taking at least one measurement of at least one electrical property while the device under test is pressed with the plurality of different levels of force is repeated a number of times.

In one or more arrangements, as one example, the method of testing the electrical interconnect 16 comprises the following steps: providing an electrical interconnect testing device; providing an electrical interconnect; the electrical interconnect having a plurality of contact points; attaching the electrical interconnect to the electrical interconnect testing device; providing a device under test; aligning the device under test with the electrical interconnect; providing an environmental chamber; pressing the device under test into the electrical interconnect to a plurality of different positions; taking at least one measurement of at least one electrical property while the device under test is pressed with the plurality of different positions; wherein the step of pressing the device under test into the electrical interconnect with the plurality of different positions is repeated a number of times; wherein the step of taking at least one measurement of at least one electrical property while the device under test is pressed with the plurality of different positions is repeated a number of times.

In one or more arrangements, as one example, the method of testing the electrical interconnect 16 comprises the following steps: providing an electrical interconnect testing device; providing an electrical interconnect; the electrical interconnect having a plurality of contact points; attaching the electrical interconnect to the electrical interconnect testing device; providing a device under test; aligning the device under test with the electrical interconnect; providing an environmental chamber; pressing the device under test into the electrical interconnect with a plurality of different levels of force while the environmental chamber is at a first temperature; taking at least one measurement of at least one electrical property while the device under test is pressed with the plurality of different levels of force while the environmental chamber is at the first temperature; wherein the step of pressing the device under test into the electrical interconnect with the plurality of different levels of force is repeated a number of times while the environmental chamber is at the first temperature; wherein the step of taking at least one measurement of at least one electrical property while the device under test is pressed with the plurality of different levels of force is repeated a number of times while the environmental chamber is at the first temperature.

In one or more arrangements, as one example, the method of testing the electrical interconnect 16 comprises the following steps: providing an electrical interconnect testing device; providing an electrical interconnect; the electrical interconnect having a plurality of contact points; attaching the electrical interconnect to the electrical interconnect testing device; providing a device under test; aligning the device under test with the electrical interconnect; providing an environmental chamber; pressing the device under test into the electrical interconnect to a plurality of different positions while the environmental chamber is at a first temperature; taking at least one measurement of at least one electrical property while the device under test is pressed with the plurality of different positions while the environmental chamber is at the first temperature; wherein the step of pressing the device under test into the electrical interconnect with the plurality of different positions is repeated a number of times while the environmental chamber is at the first temperature; wherein the step of taking at least one measurement of at least one electrical property while the device under test is pressed with the plurality of different positions is repeated a number of times while the environmental chamber is at the first temperature.

In one or more arrangements, as one example, the method of testing the electrical interconnect 16 comprises the following steps: providing an electrical interconnect testing device; providing an electrical interconnect; the electrical interconnect having a plurality of contact points; attaching the electrical interconnect to the electrical interconnect testing device; providing a device under test; aligning the device under test with the electrical interconnect; providing an environmental chamber; pressing the device under test into the electrical interconnect with a plurality of different levels of force while the environmental chamber is at a first temperature; taking at least one measurement of at least one electrical property while the device under test is pressed with the plurality of different levels of force while the environmental chamber is at the first temperature; wherein the step of pressing the device under test into the electrical interconnect with the plurality of different levels of force is repeated a number of times while the environmental chamber is at the first temperature; wherein the step of taking at least one measurement of at least one electrical property while the device under test is pressed with the plurality of different levels of force is repeated a number of times while the environmental chamber is at the first temperature; pressing the device under test into the electrical interconnect with a plurality of different levels of force while the environmental chamber is at a second temperature; taking at least one measurement of at least one electrical property while the device under test is pressed with the plurality of different levels of force while the environmental chamber is at the second temperature; wherein the step of pressing the device under test into the electrical interconnect with the plurality of different levels of force is repeated a number of times while the environmental chamber is at the second temperature; wherein the step of taking at least one measurement of at least one electrical property while the device under test is pressed with the plurality of different levels of force is repeated a number of times while the environmental chamber is at the second temperature.

In one or more arrangements, as one example, the method of testing the electrical interconnect 16 comprises the following steps: providing an electrical interconnect testing device; providing an electrical interconnect; the electrical interconnect having a plurality of contact points; attaching the electrical interconnect to the electrical interconnect testing device; providing a device under test; aligning the device under test with the electrical interconnect; providing an environmental chamber; pressing the device under test into the electrical interconnect to a plurality of different positions while the environmental chamber is at a first temperature; taking at least one measurement of at least one electrical property while the device under test is pressed with the plurality of different positions while the environmental chamber is at the first temperature; wherein the step of pressing the device under test into the electrical interconnect with the plurality of different positions is repeated a number of times while the environmental chamber is at the first temperature; wherein the step of taking at least one measurement of at least one electrical property while the device under test is pressed with the plurality of different positions is repeated a number of times while the environmental chamber is at the first temperature; pressing the device under test into the electrical interconnect to a plurality of different positions while the environmental chamber is at a second temperature; taking at least one measurement of at least one electrical property while the device under test is pressed with the plurality of different positions while the environmental chamber is at the second temperature; wherein the step of pressing the device under test into the electrical interconnect with the plurality of different positions is repeated a number of times while the environmental chamber is at the second temperature; wherein the step of taking at least one measurement of at least one electrical property while the device under test is pressed with the plurality of different positions is repeated a number of times while the environmental chamber is at the second temperature.

Testing Recipes:

In addition, testing recipes can be created using the electrical interconnect testing device 12 with cycler system 18. The testing recipes may specify a number of different variables including: whether actuator 54 of cycler system 18 will press DUT 100 into electrical interconnect 16 to a plurality of different positions, and what those plurality of different positions are; whether actuator 54 of cycler system 18 will press DUT 100 into electrical interconnect 16 to a plurality of different of levels of force, and what those plurality of different levels of force are; the temperature (or temperatures) at which environmental chamber 20 will be set when tests are being performed; what electrical property or electrical properties will be measured when DUT 100 is being pressed into electrical interconnect 16; whether the measurements are taken on one, a combination of, or all of the contact points of the electrical interconnect 16; and whether the tests are repeated, the number of times they are repeated, and the intervals at which the electrical property or electrical properties are measured.

If the testing recipe is set to press DUT 100 into electrical interconnect 16 to a plurality of different positions, the testing recipe may set the distance between each position at one-micron increments and measurements will be taken at each one-micron increment. Alternatively, if the testing recipe is set to press DUT 100 into electrical interconnect 16 with a plurality of different levels of force, the actuator 54 of cycler system 18 drives DUT 100 down into electrical interconnect 16 until a predetermined amount of resistance is met. At each increment, the testing recipe can call for testing any one contact point, all of the contact points, a random grouping of the contact points or a predetermined group of the contact points of the electrical interconnect 16. In addition, the recipe can be set to cycle (i.e. repeat) the test any number of times and in any manner determined by the testing recipe, including, as one example, varying whether the DUT 100 will be pushed down to a plurality of different positions or with a plurality of different levels of force, and varying the temperature at which environmental chamber 20 is set at.

Number of Pins Tested:

In various arrangements, as examples, system 10 is configured to be modular in nature. That is, DUT PCB 14 may be configured to have an infinite and borderless top plane and testing system 10 may be formed out of any number of electrical interconnect testing devices 12. That is, a testing system 10 may be formed of one, two, three, four, five, six, seven, eight, nine, ten or more electrical interconnect testing devices 12 all of which may be electrically connected to the same DUT PCB 14 or to different DUT PCBs 14 or to multiple DUT PCBs 14. The number of electrical interconnect testing devices 12 needed is dependent on the pin density of the electrical interconnect 16. In various arrangements, electrical interconnect 16 may have any number of pins, such as 100 pins, 1,000 pins, 5,000 pins, 10,000 pins, 20,000 pins, and so on. In one or more arrangements, a single electrical interconnect testing device 12 has the capability of testing up to 8,064 pins, which is substantially higher than any other similar testing solution presently available on the market. As such, by combining two electrical interconnect testing devices 12 up to 2×8,064=16,128 pins can be tested; by combining three electrical interconnect testing devices 12 up to 3×8,064=24,192 pins can be tested; by combining four electrical interconnect testing devices 12 up to 4×8,064=32,256 pins can be tested; and so on. This provides never before met testing capability and higher pin density. The configuration of the electrical interconnect testing devices 12 may be chosen based upon space requirements, board design, mechanical requirements of other machines, etc.

Testing system 10 may contain any number of electrical interconnect testing devices 12 in any arrangement. That is, testing system 10 can essentially take on any form with any number of electrical interconnect testing devices 12. Examples include:

One electrical interconnect testing device 12 positioned on one side of DUT PCB 14.

Two electrical interconnect testing devices 12, one positioned on opposing sides of the DUT PCB 14.

Two electrical interconnect testing devices 12, both positioned on one side of the DUT PCB 14 in a lengthwise arrangement.

Two electrical interconnect testing devices 12, both positioned on one side of the DUT PCB 14 in a side-by-side parallel arrangement.

Two electrical interconnect testing devices 12, one positioned on one side and the other positioned on an adjacent side of the DUT PCB 14, such as an L-shape.

Three electrical interconnect testing devices 12, all positioned on one side of the DUT PCB 14 in a lengthwise arrangement.

Three electrical interconnect testing devices 12, all positioned on one side of the DUT PCB 14 in a side-by-side parallel arrangement.

Three electrical interconnect testing devices 12, positioned in a C-shape around the DUT PCB 14.

Four electrical interconnect testing devices 12, all positioned on one side of the DUT PCB 14 in a lengthwise arrangement.

Four electrical interconnect testing devices 12, all positioned on one side of the DUT PCB 14 in a side-by-side parallel arrangement.

Four electrical interconnect testing devices 12, positioned in a square-shape around the DUT PCB 14.

Any other shape or configuration of electrical interconnect testing devices 12 are hereby contemplated for use.

From the above discussion, and the discussions from the references incorporated herein, it will be appreciated that the testing system 10 presented herein: improves upon the state of the art; quickly converts between configurations for testing different electrical interconnects; easily converts between configurations for testing different electrical interconnects; easy to use; provides accurate testing for electrical interconnects; can be used with a wide variety of electrical interconnects; is relatively inexpensive; has a long useful life; has a small footprint; minimizes the amount of space required to test a variety of electrical interconnects; minimizes the capital cost for testing equipment for testing a variety of electrical interconnects; provides for quick removal of and replacement of DUT PCBs having electrical interconnects thereon; is high quality; is durable; can be used with a wide variety of other testing equipment; is modular in nature; can be used with any size of DUT PCB; can be used with any test socket; provides a high density of pins; can be formed out of a plurality of testing modules; has the ability to perform tests under extreme conditions such as high or low temperatures.

What is claimed:

1. A method of testing an electrical interconnect, the steps comprising:

providing an electrical interconnect testing device;

providing an electrical interconnect;

the electrical interconnect having a plurality of contact points;

attaching the electrical interconnect to the electrical interconnect testing device;

providing a device under test;

aligning the device under test with the electrical interconnect;

providing an environmental chamber;

pressing the device under test into the electrical interconnect with a plurality of different levels of force while the environmental chamber is at a first temperature; and taking at least one measurement of at least one electrical property while the device under test is pressed with the plurality of different levels of force and the environmental chamber is set to the first temperature.

2. The method of claim 1, further comprising:

setting the environmental chamber to a second temperature;

pressing the device under test into the electrical interconnect with the plurality of different levels of force while the environmental chamber is at the second temperature; and taking at least one measurement of at least one electrical property while the device under test is pressed with the plurality of different levels of force and the environmental chamber is at the second temperature.

3. The method of claim 1, further comprising the step of taking a position measurement when the device under test is pressed into the electrical interconnect with the plurality of different levels of force.

4. The method of claim 1, wherein the at least one electrical property is one of resistance, capacitance, leakage, or inductance.

5. The method of claim 1 wherein the measurement of the at least one electrical property is taken on one of the plurality of contact points of the electrical interconnect.

6. The method of claim 1 wherein the measurement of the at least one electrical property is taken on a combination of the plurality of contact points of the electrical interconnect.

7. The method of claim 1 wherein the first temperature is significantly above ambient temperature or significantly below ambient temperature.

8. The method of claim 1 wherein the step of pressing the device under test into the electrical interconnect with the plurality of different levels of force while the environmental chamber is at the first temperature is repeated a number of times; and wherein the step of taking at least one measurement of at least one electrical property while the device under test is pressed with the plurality of different levels of force and the environmental chamber is at the first temperature is repeated a number of times.

9. The method of claim 1 wherein the plurality of different levels of force are determined by a testing recipe.

10. A method of testing an electrical interconnect, the steps comprising:

providing an electrical interconnect testing device;

providing an electrical interconnect;

the electrical interconnect having a plurality of contact points;

attaching the electrical interconnect to the electrical interconnect testing device;

providing a device under test;

aligning the device under test with the electrical interconnect;

providing an environmental chamber;

pressing the device under test into the electrical interconnect with a plurality of different levels of force while the environmental chamber is at a first temperature; and taking at least one measurement of at least one electrical property while the device under test is pressed with the plurality of different levels of force and the environmental chamber is set to the first temperature;

pressing the device under test into the electrical interconnect with the plurality of different levels of force while the environmental chamber is at a second temperature; and taking at least one measurement of at least one electrical property while the device under test is pressed with the plurality of different levels of force and the environmental chamber is set to the second temperature.

11. The method of claim 10, further comprising the step of taking a position measurement when the device under test is pressed into the electrical interconnect with the plurality of different levels of force.

12. The method of claim 10, wherein the at least one electrical property is one of resistance, capacitance, leakage, or inductance.

13. The method of claim 10 wherein the measurement of the at least one electrical property is taken on one of the plurality of contact points of the electrical interconnect.

14. The method of claim 10 wherein the measurement of the at least one electrical property is taken on a combination of the plurality of contact points of the electrical interconnect.

15. The method of claim 10 wherein the first temperature is significantly above ambient temperature or significantly below ambient temperature.

16. The method of claim 10 wherein the second temperature is significantly above ambient temperature or significantly below ambient temperature.

17. The method of claim 10 wherein the first temperature is significantly above ambient temperature and the second temperature is significantly below ambient temperature.

18. The method of claim 10 wherein the step of pressing the device under test into the electrical interconnect with the plurality of different levels of force while the environmental chamber is at the first temperature is repeated a number of times; and wherein the step of taking at least one measurement of at least one electrical property while the device under test is pressed with the plurality of different levels of force and the environmental chamber is at the first temperature is repeated a number of times.

19. The method of claim 10 wherein the step of pressing the device under test into the electrical interconnect with the plurality of different levels of force while the environmental chamber is at the second temperature is repeated a number of times; and wherein the step of taking at least one measurement of at least one electrical property while the device under test is pressed with the plurality of different levels of force and the environmental chamber is at the second temperature is repeated a number of times.

20. The method of claim 10 wherein the plurality of different levels of force are determined by a testing recipe.

21. A method of testing an electrical interconnect, the steps comprising:

providing an electrical interconnect testing device;
providing an electrical interconnect;
the electrical interconnect having a plurality of contact points;
attaching the electrical interconnect to the electrical interconnect testing device;
providing a device under test;
aligning the device under test with the electrical interconnect;
providing an environmental chamber;

pressing the device under test into the electrical interconnect to a plurality of different positions while the environmental chamber is at a first temperature; and taking at least one measurement of at least one electrical property while the device under test is pressed to the plurality of different positions and the environmental chamber is set to the first temperature.

22. The method of claim 21, further comprising:

setting the environmental chamber to a second temperature;

pressing the device under test into the electrical interconnect to the plurality of different positions while the environmental chamber is at the second temperature; and taking at least one measurement of at least one electrical property while the device under test is pressed to the plurality of different positions and the environmental chamber is at the second temperature.

23. The method of claim 21, wherein the at least one electrical property is one of resistance, capacitance, leakage, or inductance.

24. The method of claim 21 wherein the measurement of the at least one electrical property is taken on one of the plurality of contact points of the electrical interconnect.

25. The method of claim 21 wherein the measurement of the at least one electrical property is taken on a combination of the plurality of contact points of the electrical interconnect.

26. The method of claim 21 wherein the first temperature is significantly above ambient temperature or significantly below ambient temperature.

27. The method of claim 21 wherein the step of pressing the device under test into the electrical interconnect to the plurality of different positions while the environmental chamber is at the first temperature is repeated a number of times; and wherein the step of taking at least one measurement of at least one electrical property while the device under test is pressed to the plurality of different positions and the environmental chamber is at the first temperature is repeated a number of times.

28. The method of claim 21 wherein the plurality of different positions are determined by a testing recipe.

29. A method of testing an electrical interconnect, the steps comprising:

providing an electrical interconnect testing device;
providing an electrical interconnect;
the electrical interconnect having a plurality of contact points;
attaching the electrical interconnect to the electrical interconnect testing device;
providing a device under test;
aligning the device under test with the electrical interconnect;
providing an environmental chamber;
pressing the device under test into the electrical interconnect to a plurality of different positions while the environmental chamber is at a first temperature;
taking at least one measurement of at least one electrical property while the device under test is pressed to the plurality of different positions and the environmental chamber is set to the first temperature;
pressing the device under test into the electrical interconnect to a plurality of different positions while the environmental chamber is at a second temperature;
taking at least one measurement of at least one electrical property while the device under test is pressed to the plurality of different positions and the environmental chamber is set to the second temperature.

30. The method of claim 29, wherein the at least one electrical property is one of resistance, capacitance, leakage, or inductance.

31. The method of claim 29 wherein the measurement of the at least one electrical property is taken on one of the plurality of contact points of the electrical interconnect.

32. The method of claim 29 wherein the measurement of the at least one electrical property is taken on a combination of the plurality of contact points of the electrical interconnect.

33. The method of claim 29 wherein the first temperature is significantly above ambient temperature or significantly below ambient temperature.

34. The method of claim 29 wherein the second temperature is significantly above ambient temperature or significantly below ambient temperature.

35. The method of claim 29 wherein the first temperature is significantly above ambient temperature and the second temperature is significantly below ambient temperature.

36. The method of claim 29 wherein the step of pressing the device under test into the electrical interconnect to the plurality of different positions while the environmental chamber is at the first temperature is repeated a number of times; and wherein the step of taking at least one measurement of at least one electrical property while the device under test is pressed to the plurality of different positions and the environmental chamber is at the first temperature is repeated a number of times.

37. The method of claim 29 wherein the step of pressing the device under test into the electrical interconnect to the plurality of different positions while the environmental chamber is at the second temperature is repeated a number of times; and wherein the step of taking at least one measurement of at least one electrical property while the device under test is pressed to the plurality of different positions and the environmental chamber is at the second temperature is repeated a number of times.

38. The method of claim 29 wherein the plurality of different positions are determined by a testing recipe.

39. A method of testing an electrical interconnect, the steps comprising:

providing an electrical interconnect testing device;
providing an electrical interconnect;
attaching the electrical interconnect to the electrical interconnect testing device;

24 providing a device under test;
providing an environmental chamber;
providing a testing recipe;
adjusting the environmental chamber to a first temperature according to the testing recipe;
pressing the device under test into the electrical interconnect testing device according to the testing recipe while the environmental chamber is at the first temperature;
taking at least one measurement of at least one electrical property while the device under test is pressed into the electrical interconnect according to the testing recipe and the environmental chamber is at the first temperature.

40. The method of claim 39, wherein the testing recipe controls whether the device under test is pressed into the electrical interconnect testing device with a plurality of different levels of force or to a plurality of different positions; and
wherein the testing recipe determines the plurality of different levels of force or the plurality of different positions.

41. The method of claim 39, wherein the testing recipe controls whether the at least one measurement taken of is resistance, capacitance, leakage, or inductance.

42. The method of claim 39, further comprising:
adjusting the environmental chamber to a second temperature according to the testing recipe;
pressing the device under test into the electrical interconnect testing device according to the testing recipe while the environmental chamber is at the second temperature;
taking at least one measurement of at least one electrical property while the device under test is pressed into the electrical interconnect according to the testing recipe and the environmental chamber is at the second temperature.

43. The method of claim 39, further comprising:
wherein the step of pressing the device under test into the electrical interconnect is repeated a number of times according to the testing recipe;
wherein the step of taking at least one measurement of at least one electrical property while the device under test is pressed into the electrical interconnect is repeated a number of times according to the testing recipe.

* * * * *